United States Patent
Lee et al.

(10) Patent No.: US 11,694,469 B2
(45) Date of Patent: Jul. 4, 2023

(54) DISPLAY DEVICE HAVING AN INITIALIZATION LINE

(71) Applicant: SAMSUNG DISPLAY CO., LTD., Yongin-si (KR)

(72) Inventors: Ki June Lee, Yongin-si (KR); Tae Hoon Yang, Yongin-si (KR); Dae Young Lee, Yongin-si (KR); Sun Hwa Lee, Yongin-si (KR); Ki Hyun Pyo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/394,507

(22) Filed: Aug. 5, 2021

(65) Prior Publication Data

US 2022/0156477 A1    May 19, 2022

(30) Foreign Application Priority Data

Nov. 16, 2020   (KR) .......................... 10-2020-0152879

(51) Int. Cl.
*G06V 40/13* (2022.01)
*G09G 3/32* (2016.01)
(Continued)

(52) U.S. Cl.
CPC ........... *G06V 40/1318* (2022.01); *G09G 3/32* (2013.01); *H10K 59/1213* (2023.02);
(Continued)

(58) Field of Classification Search
CPC .................. G06V 40/1318; G09G 3/32; G09G 2310/0267; G09G 2330/02; H01L 27/3234; H01L 27/3262; H01L 27/3276; H01L 27/1225; H01L 27/124; H01L 27/1251; H01L 29/78672; H01L 29/7869; H10K 59/131; H10K 59/65; H10K 59/1213

See application file for complete search history.

(56) References Cited

U.S. PATENT DOCUMENTS 10,839,192 B2 * 11/2020 Chen .................... G09G 3/3233
2019/0377923 A1 * 12/2019 Chen ................... H04M 1/0266
(Continued)

FOREIGN PATENT DOCUMENTS

KR   10-2020-0038388   4/2020

*Primary Examiner* — Stephen G Sherman
(74) *Attorney, Agent, or Firm* — F. Chau & Associates, LLC

(57) ABSTRACT

A display device includes a substrate and a pixel layer disposed on the substrate. The pixel layer includes a circuit element layer having an opening. The circuit element layer includes a first semiconductor layer and a first conductive layer that includes a first scan line pattern and an emission control line. A second conductive layer is disposed on the first conductive layer and includes a first initialization line, a second scan line pattern and a third scan line pattern. A second semiconductor layer is disposed on the second conductive layer. A third conductive layer is disposed on the second semiconductor layer and includes fourth and fifth scan line patterns. The first initialization line includes a first portion and a second portion each extending in a first direction, and a third portion disposed therebetween. The second portion extends diagonally with respect to the first direction.

19 Claims, 22 Drawing Sheets

(51) Int. Cl.
*H10K 59/131* (2023.01)
*H10K 59/65* (2023.01)
*H10K 59/121* (2023.01)
*H01L 29/786* (2006.01)
*H01L 27/12* (2006.01)

(52) U.S. Cl.
CPC ............ *H10K 59/131* (2023.02); *H10K 59/65* (2023.02); *G09G 2310/0267* (2013.01); *G09G 2330/02* (2013.01); *H01L 27/124* (2013.01); *H01L 27/1225* (2013.01); *H01L 27/1251* (2013.01); *H01L 29/7869* (2013.01); *H01L 29/78672* (2013.01)

(56) References Cited

U.S. PATENT DOCUMENTS

2020/0104562 A1* 4/2020 Sung .................. H01L 31/12
2021/0384229 A1* 12/2021 Lee ..................... H01L 27/1255

\* cited by examiner

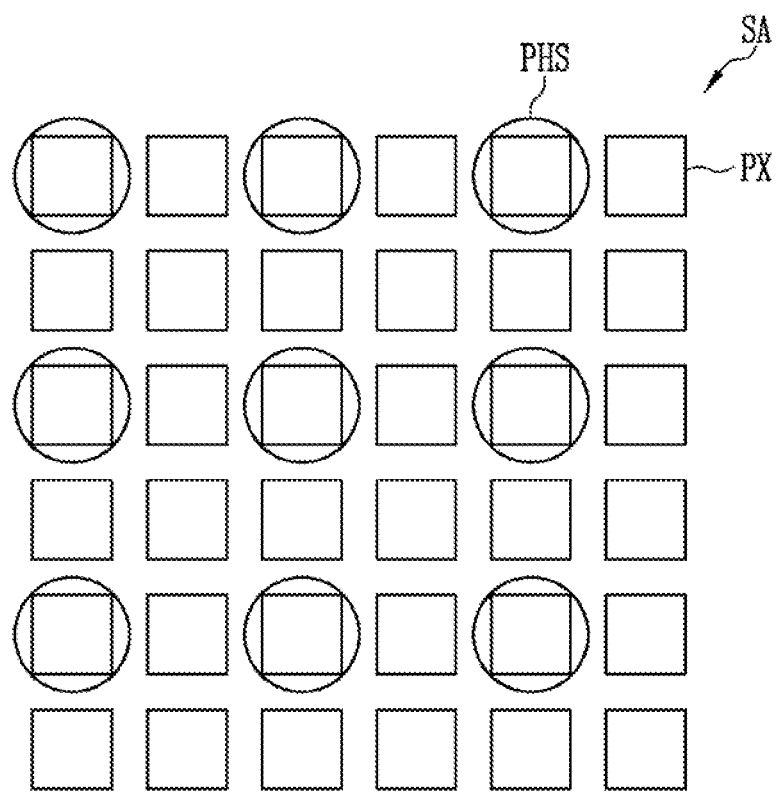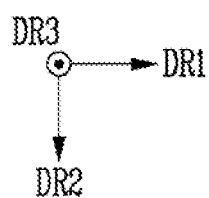

DISPLAY DEVICE HAVING AN INITIALIZATION LINE

CROSS-REFERENCE TO RELATED APPLICATION

This application claims priority under 35 U.S.C. § 119 to Korean Patent Application No. 10-2020-0152879, filed on Nov. 16, 2020 in the Korean Intellectual Property Office, the disclosure of which is incorporated by reference in its entirety herein.

1. TECHNICAL FIELD

The present inventive concepts relate to a display device.

2. DISCUSSION OF RELATED ART

As display devices such as smartphones or tablet personal computers (PCs) are used in an increasing variety of fields, biometric information authentication methods using user fingerprints or the like have been increasingly used. A fingerprint sensor may be embedded in or attached to a display device to provide a fingerprint sensing function.

A photosensitive type fingerprint sensor may include a light source and an optical sensor. The optical sensor may acquire fingerprint information by receiving reflected light generated by a user's fingerprint.

Meanwhile, a display device may include an opening, such as a pinhole, for controlling reflected light generated by a user's fingerprint so that it reaches an optical sensor. The opening may be formed in a circuit element layer on which circuit elements and lines are disposed to minimize the thickness of the display device.

However, to maintain the reliability of the fingerprint sensing function, a width (e.g., an area) of an opening needs to be secured at a certain minimum level.

SUMMARY OF THE INVENTION

An embodiment of the present inventive concepts provides a display device that sufficiently secures a width (e.g., an area) of an opening formed in a circuit element layer.

According to an embodiment of the present inventive concepts, a display device includes a substrate. A pixel layer is disposed on the substrate. The pixel layer includes a circuit element layer having an opening. The circuit element layer includes a first semiconductor layer, a first conductive layer disposed on the first semiconductor layer, the first conductive layer including a first scan line pattern and an emission control line, a second conductive layer disposed on the first conductive layer, the second conductive layer including a first initialization line that transmits a first initialization voltage, a second scan line pattern, and a third scan line pattern, a second semiconductor layer disposed on the second conductive layer, and a third conductive layer disposed on the second semiconductor layer, the third conductive layer including a fourth scan line pattern and a fifth scan line pattern. The first initialization line includes a first portion and a second portion each extending substantially in a first direction, and a third portion disposed directly between the first portion and the second portion and extending diagonally with respect to the first direction.

In an embodiment, the first portion, the second portion, and the third portion may be integrally formed.

In an embodiment, the second scan line pattern and the third scan line pattern may extend in the first direction.

In an embodiment, the first initialization line, the third scan line pattern, and the second scan line pattern may be sequentially disposed in a second direction different from the first direction.

In an embodiment, an interval between the first portion and the third scan line pattern may be smaller than an interval between the second portion and the third scan line pattern.

In an embodiment, the second conductive layer may further include a first power line spaced apart from the second scan line pattern in the second direction.

In an embodiment, the fourth scan line pattern and the fifth scan line pattern may be extend in the first direction, and the fifth scan line pattern may be spaced apart from the fourth scan line pattern in the second direction.

In an embodiment, the second scan line pattern and the fourth scan line pattern may overlap each other and may be configured to transmit the same scan signal.

In an embodiment, the third scan line pattern and the fifth scan line pattern may overlap each other and may transmit the same scan signal.

In an embodiment, the first scan line pattern and the emission control line may be formed to extend in the first direction, and the emission control line may be spaced apart from the first scan line pattern in a second direction different from the first direction.

In an embodiment, the first conductive layer may further include an island electrode disposed to be spaced apart from the first scan line pattern and the emission control line, the second conductive layer may further include a first power line formed to extend in the first direction and configured to transmit a driving voltage, and the island electrode and the first power line may overlap each other.

In an embodiment, the circuit element layer may further include a fourth conductive layer disposed on the third conductive layer and including a second initialization line for transmitting a second initialization voltage, and the second initialization line may be formed to extend in the first direction and may include a protrusion protruding in a second direction different from the first direction.

In an embodiment, the second initialization line ay overlap the first portion.

In an embodiment, the circuit element layer may further include a fifth conductive layer disposed on the fourth conductive layer and including a second power line for transmitting a data line and a driving voltage.

In an embodiment, the data line and the second power line may be extend in the second direction and may be spaced apart from each other in the first direction.

In an embodiment, the first initialization line, the second initialization line, the data line, and the second power line may not disposed on the opening.

In an embodiment, the first semiconductor layer may include a polysilicon semiconductor, and the second semiconductor layer may include an oxide semiconductor.

In an embodiment, the pixel layer may further include a light-emitting element Payer disposed on the circuit element layer.

In an embodiment, the display device may further include a sensor layer including optical sensors, wherein the substrate is disposed on the sensor layer.

In an embodiment, the optical sensors may be configured to detect a user's fingerprint by detecting light emitted from the pixel layer and reflected by a user's finger.

According to an embodiment of the present inventive concepts, a display device includes a display panel having a substrate including a display area that includes a plurality of pixels and a sensing area defined in at least a partial portion of the display area. A pixel layer is disposed in the display area. The pixel layer includes a circuit element layer having an opening having a first area defined by a first width in a first direction and a second width in a second direction that crosses the first direction. A sensor layer is disposed on the display panel in the sensing area. The sensor layer includes optical sensors configured to sense a user fingerprint. The circuit element layer includes a plurality of semiconductor layers and a plurality of conductive layers. The plurality of conductive layers includes a first conductive layer including a first initialization line that transmits a first initialization voltage and a second conductive layer disposed on the first conductive layer. The second conductive layer includes a power line and a data line that both extend substantially in the second direction and are spaced apart from each other by a first distance in the first direction. The first distance defines the first width of the opening. The first initialization line includes a first portion and a second portion each extending substantially in the first direction, and a third portion disposed directly between the first portion and the second portion and extending diagonally with respect to the first and second directions. The third portion defines the second width of the opening. The first area has a size that permits light reflected by a user's finger to be transmitted through the opening.

BRIEF DESCRIPTION OF THE DRAWINGS

FIGS. 3A to 3E are plan views illustrating an arrangement structure of pixels and optical sensors according to embodiments of the present inventive concepts.

DETAILED DESCRIPTION OF EMBODIMENTS

Figure 1:
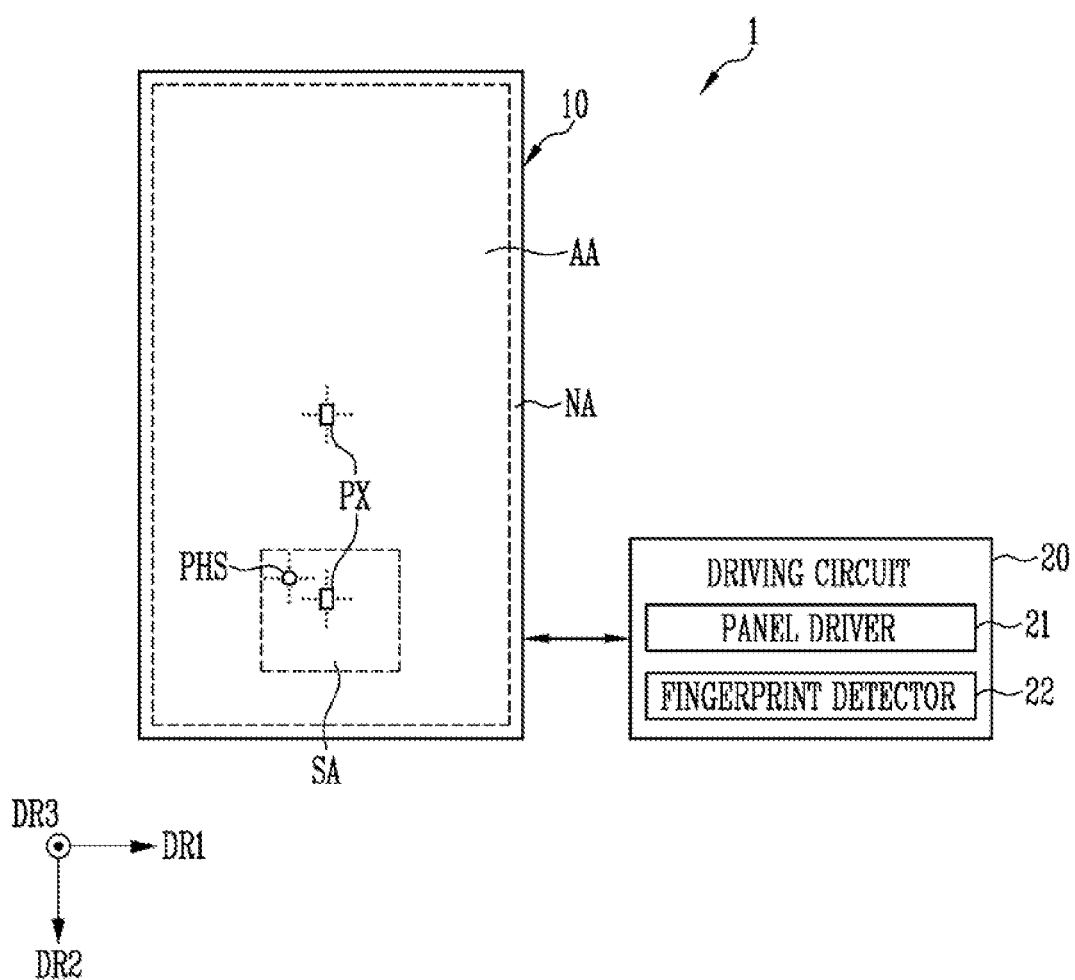
FIGS. 1 and 2 are plan views illustrating display devices according to embodiments of the present inventive concepts.

While the present inventive concepts encompass various modifications and embodiments, certain embodiments thereof will be described and illustrated by way of example in the accompanying drawings. However, it should be understood that the present inventive concepts are not limited to the particular embodiments disclosed, and, on the contrary, the present inventive concepts cover all modifications, equivalents, and alternatives falling within the spirit and scope of the present inventive concepts.

In describing the drawings, like reference numerals are used for like elements. In the accompanying drawings, the sizes of structures may be exaggerated for clarity. Although the terms "first", "second", etc. are used herein to describe various elements, these elements should not be limited by these terms. The terms are used only for the purpose of distinguishing one element from another. For example, without departing from the scope of the present inventive concepts, a second element could be termed a first element, and similarly a first element could be also termed a second element. A single form of expression is meant to include multiple elements unless otherwise stated.

It will be understood that the terms "comprises" and/or "comprising," or "includes" and/or "including," when used in this specification, specify the presence of stated features, integers, steps, operations, elements, components, and/or combinations thereof but do not preclude the presence or addition of one or more other features, integers, steps, operations, elements, components and/or combinations thereof.

In addition, in an embodiment in which a certain part is connected to the other part, it may include not only an embodiment where the part is "directly connected" to the other part, but also an embodiment in which the part is "connected" to the other part with another element interposed therebetween.

In addition, when a layer, a film, an area, or a plate is referred to as being "on" or "under" another layer, another film, another area, or another plate, it can be "directly" or "indirectly" on the other layer, film, area, plate, or one or more intervening layers may also be present. When a layer, a film, an area, or a plate is referred to as being "directly on" or "directly under" another element such as another layer, another film, another area or another plate, no intervening elements may be present. Further, in the present inventive concepts, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, area, or plate is referred to as being "beneath" another element, it can be directly beneath the other element or intervening elements may also be present.

Hereinafter, embodiments of the present inventive concepts will be described in more detail with reference to the accompanying drawings.

Figure 2:
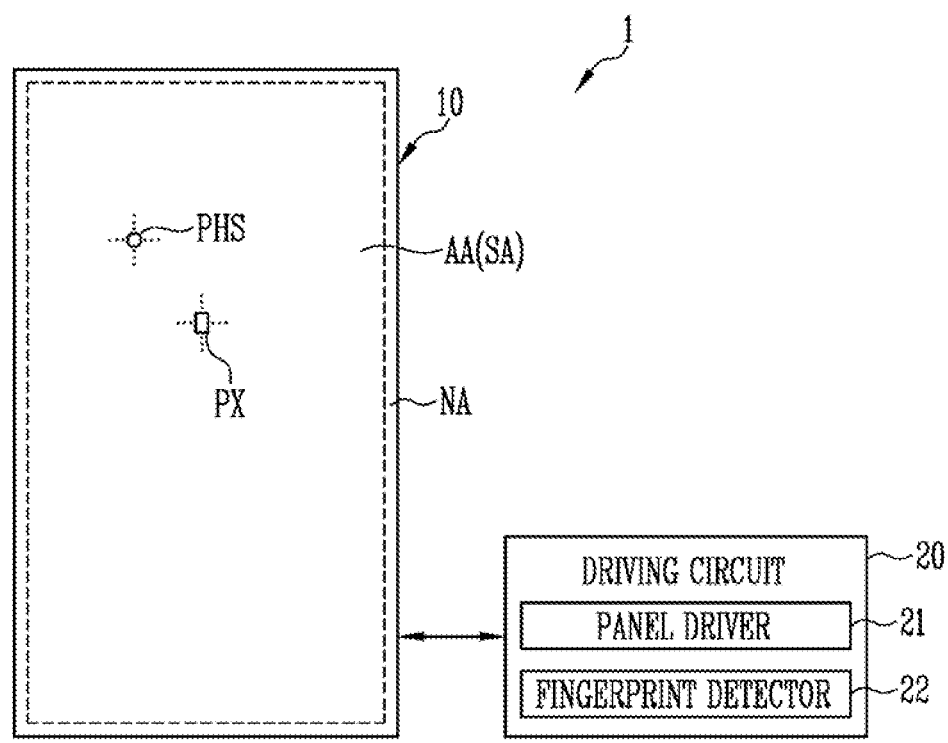
Figure 2:
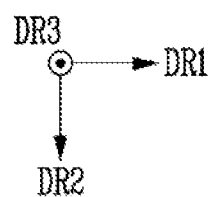

FIGS. 1 and 2 are schematic plan views illustrating display devices according to embodiments of the present inventive concepts. More specifically, FIGS. 1 and 2 are schematic plan views illustrate a display panel 10 provided in a display device 1 according to embodiments of the present inventive concepts and a driving circuit 20 for driving the display panel 10. For convenience, in FIGS. 1 and 2, the display panel 10 and the driving circuit 20 are separately illustrated. However, embodiments of the present inventive concepts are not limited thereto. For example, the entirety or a partial portion of the driving circuit may be integrally implemented on the display panel 10.

Referring to the embodiments of FIGS. 1 and 2, the display device 1 may include the display panel 10 and the driving circuit 20 for driving the display panel 10.

The display panel 10 may include a display area AA and a non-display area NA. The display area AA may be an area in which a plurality of pixels PX are disposed and may be referred to as an active area. In an embodiment, each of the pixels PX may include one or more light-emitting elements. The display device 1 may display an image in the display area AA by driving the pixels PX in response to image data input from an external source. In an embodiment, the display area AA may be parallel to a plane defined by a first direction axis (e.g., an axis extending in a first direction DR1) and a second direction axis (e.g., an axis extending in a second direction DR2). While the embodiment of FIG. 1 shows the second direction DR2 as being a different direction that is perpendicular to the first direction DR1, embodiments of the present inventive concepts are not limited thereto and the second direction DR2 may cross the first direction DR1 in various different angles. A direction perpendicular to a display surface which is a thickness direction of the display device 1 may be defined as a third direction DR3. In an embodiment, the third direction DR3 may be perpendicular to the first and second directions DR1, DR2.

A front surface (e.g., an upper surface) and a rear surface (e.g., a lower surface) of each member or unit of the display device 1 to be described below may be distinguished in the third direction DR3. However, the first to third directions DR1, DR2, and DR3 shown in the embodiment of FIG. 1 are merely examples, and the first to third directions DR1, DR2, and DR3 may be relative concepts and may be other directions in some embodiments.

In various embodiments of the present inventive concepts, the display area AA may include a sensing area SA. The sensing area SA may include at least a partial portion of the pixels PX disposed in the display area AA.

As shown in the embodiment of FIG. 1, at least a partial portion of the display area AA, may include the sensing area SA. However, as shown in the embodiment of FIG. 2, the sensing area SA may be defined in the entire display area AA.

FIG. 1 illustrates an embodiment in which only one sensing area SA is formed in the display area AA. However, embodiments of the present inventive concepts are not limited thereto. For example, a plurality of sensing areas SA arranged regularly or irregularly may be formed in the display area AA. In this embodiment, the plurality of sensing areas SA may have the same or different areas and shapes.

In addition, FIG. 1 illustrates an embodiment in which the sensing area SA is formed in at least a partial portion of the display area AA. However, embodiments of the present inventive concepts are not limited thereto. For example, the display area AA and the sensing area SA may be provided to only partially overlap each other.

The non-display area NDA may be an area disposed around the display area AA and may be referred to as a non-active area. According to embodiments of the present inventive concepts, the non-display area NA may collectively refer to the remaining area of the display panel 10 excluding the display area AA.

In an embodiment, the non-display area NA may include a line area, a pad area, and various dummy areas.

In an embodiment, the display device 1 may further include a plurality of optical sensors PHS provided in the sensing area SA. The optical sensors PHS may detect that light emitted from a light source is reflected by a user's finger and may analyze the reflected light to detect a user's fingerprint. Hereinafter, the present inventive concepts will be described with an example in which the optical sensors PHS are used for detecting a fingerprint. However, the optical sensors PHS may be used for performing various other functions as a touch sensor, a scanner, and the like.

In an embodiment of the present inventive concepts, the optical sensors PHS may be disposed in the sensing area SA. In this embodiment, the optical sensors PHS may overlap at least a partial portion or an entire portion of the pixels PX provided in the sensing area SA or may be disposed around the pixels Pk. For example, at least a partial portion or an entire portion of the optical sensors PHS may be provided between the pixels PX. The arrangement relationship between the optical sensor PHS and the pixel PX will be described in detail with reference to the embodiments of FIGS. 3A to 3E.

When the optical sensors PHS are disposed adjacent to the pixels PX, the optical sensors PHS may use the light-emitting element, which is provided in at least one pixel PX in the sensing area SA or around the sensing area AS, as light sources. In this embodiment, the optical sensors PHS may constitute photosensitive type fingerprint sensors together with the pixels PX of the sensing area SA, such as the light-emitting elements provided in the pixels PX. As described above, when a fingerprint sensor-embedded display device is constituted using the pixels PX as light sources without a separate external light source, the module thicknesses of a photosensitive type fingerprint sensor and a display device having the same may be reduced, and manufacturing costs may be reduced.

In an embodiment, the optical sensors PHS may be disposed on a first surface, such as a rear surface, opposite to a second surface, such as a front surface, on which an image is displayed among both surfaces of the display panel 10. However, embodiments of the present inventive concepts are not limited thereto. For example, the optical sensors PHS may be disposed on the second surface on which an image is displayed among both surfaces of the display panel 10.

The driving circuit 20 may drive the display panel 10. For example, in an embodiment, the driving circuit 20 may output a data signal corresponding to image data to the display panel 10 or may output a driving signal for the optical sensor PHS and receive a sensing signal received from the optical sensor PHS. The driving circuit 20 receiving the sensing signal may detect a shape of a user's fingerprint using the sensing signal.

As shown in the embodiment of FIG. 1, the driving circuit 20 may include a panel driver 21 and a fingerprint detector 22. For convenience, in FIGS. 1 and 2, the panel driver 21 and the fingerprint detector 22 are separately illustrated. However, embodiments of the present inventive concepts are not limited thereto. For example, at least a partial portion of the fingerprint detector 22 may be integrated with the panel driver 21, or the fingerprint detector 22 may operate to interwork with the panel driver 21.

The panel driver 21 may supply a data signal corresponding to image data to the pixels PX by sequentially scanning the pixels PX of the display area AA. Accordingly, the display panel 10 may display an image corresponding to the image data.

In an embodiment, at least a partial portion of the components of the panel driver 21 may be formed directly on the display panel 10.

In an embodiment, the panel driver 21 may supply a driving signal for sensing a fingerprint to the pixels PX. The driving signal may be supplied to the pixels PX so that the pixels PX emit light to provide a light source for the optical sensor PHS. In this embodiment, the driving signal for sensing the fingerprint may be supplied to the pixels PX disposed in a specific area within the display panel 10, such as the pixels PX disposed in the sensing area SA.

The driving signal for sensing the fingerprint may be provided by the fingerprint detector 22. The fingerprint detector 22 may transmit a driving signal for driving the optical sensors PHS to the optical sensors PHS and may detect a user fingerprint based on a sensing signal received from the optical sensors PHS.

FIGS. 3A to 3E are plan views illustrating an arrangement structure of pixels and optical sensors according to embodiments of the present inventive concepts. FIGS. 3A to 3E illustrate different embodiments of a relative size, resolution, and arrangement relationship between at least one pixel PX and et least one optical sensor PHS which are provided in a sensing area SA.

Figure 3A:
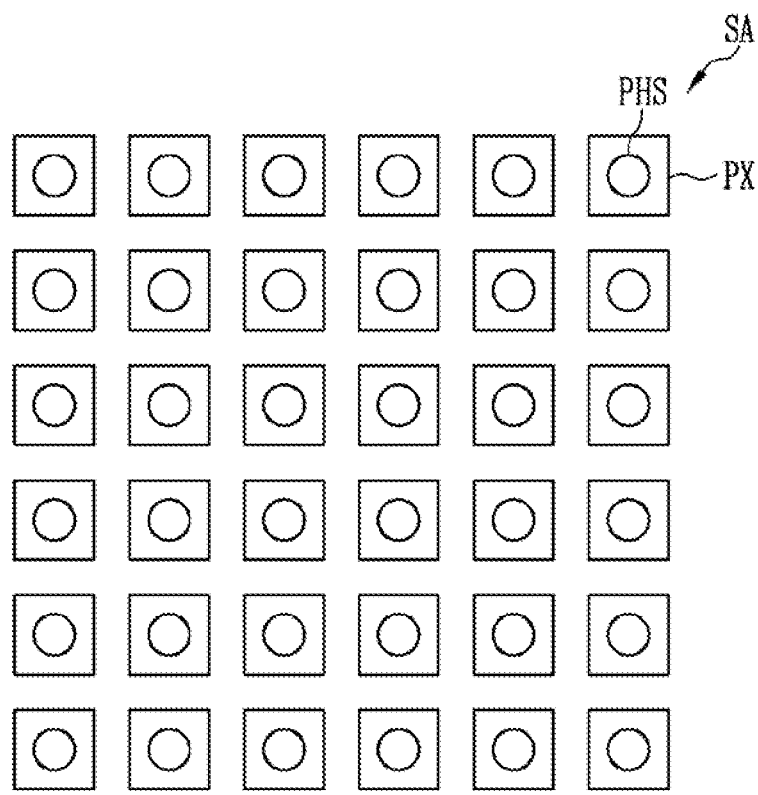
Figure 3A:
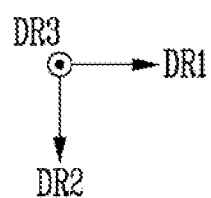

Referring to the embodiment of FIG. 3A, the optical sensors PHS may be disposed with the same resolution (density) as the pixels PX in the sensing area SA. For example, the same number of the optical sensors PHS as the pixels PX may be disposed in the sensing area SA. In this embodiment, pairs of the pixels PX and the optical sensors PHS form a one-to-one correspondence. In the embodiment of FIG. 3A, the pixels PX and the optical sensors PHS are illustrated as being disposed to overlap each other (e.g., in the third direction DR3). However, in an embodiment, the pixels PX and the optical sensors PHS may be disposed so that at least a partial portion of the optical sensors PHS do not overlap the pixels or at least a partial portion of the optical sensors PHS only partially overlap the pixels PX.

In the embodiment of FIG. 3A, the optical sensors PHS are illustrated as having a size (e.g., area in a plane defined in the first and second directions DR1, DR2) that is smaller than that of the pixels PX. However, embodiments of the present inventive concepts are not limited thereto. For example, the optical sensors PHS may have a size that is greater than or equal to that of the pixels PX. Such embodiments are shown in FIGS. 3C and 3D.

Referring to the embodiments of FIGS. 3B to 3E, the optical sensors PHS may be disposed with a lower resolution than the pixels PX in the sensing area SA. For example, a smaller number of the optical sensors PHS than the pixels PX may be disposed in the sensing area SA. FIGS. 3B to 3E illustrate an example in which one optical sensor PHS is disposed per four pixels PX. However, embodiments of the present inventive concepts are not limited thereto and the number of the lower density optical sensors PHS as compared to the pixels PX may vary.

Figure 3B:
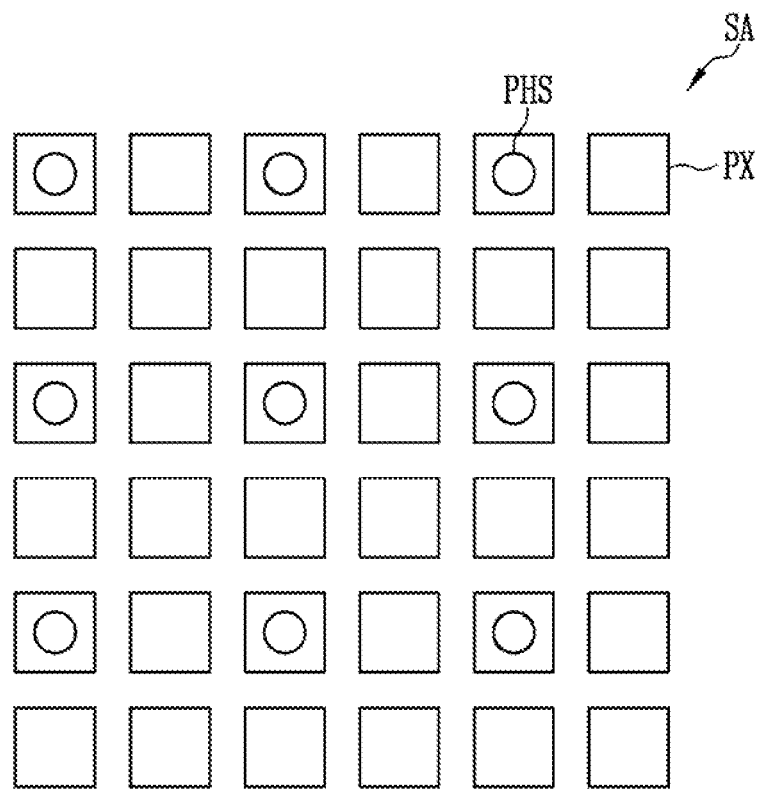
Figure 3B:
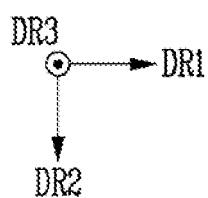
Figure 3D:
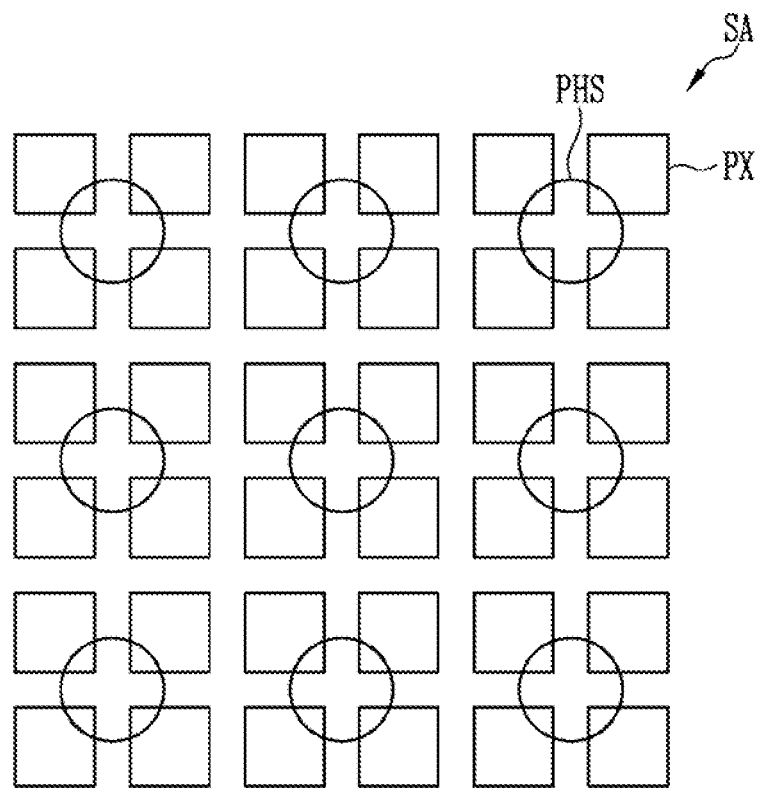
Figure 3D:
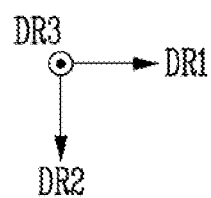
Figure 3E:
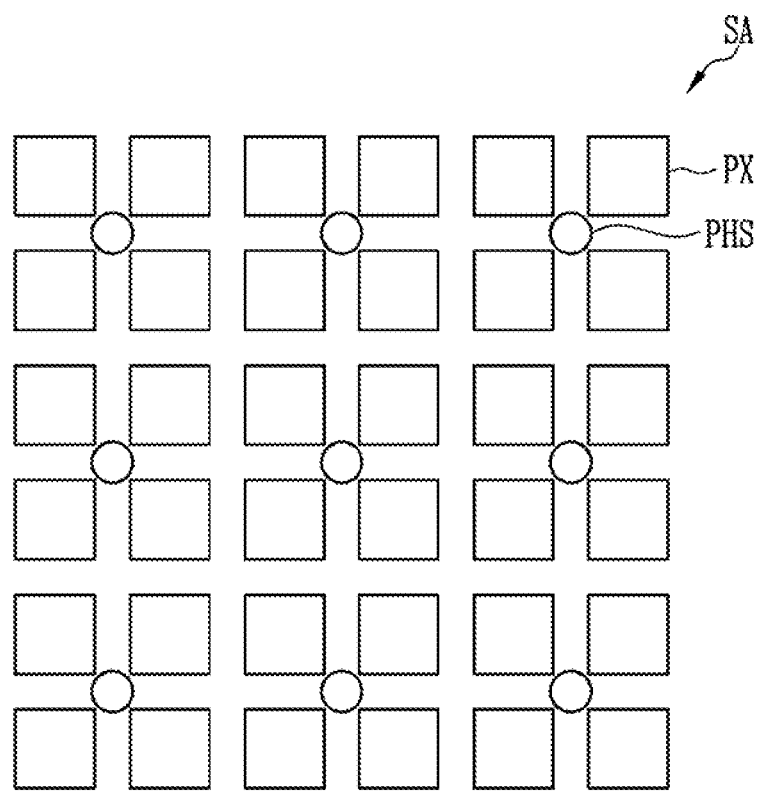

In the embodiments of FIGS. 3B and 3E, the optical sensors PHS may have a size that is smaller than that of the pixels PX. However, as shown in the embodiments of FIGS. 3C and 3D, the optical sensors PHS may have a size that is greater than that of the pixels PX.

When the optical sensors PHS are disposed with a lower resolution than the pixels PX, at least a partial portion of the optical sensors PHS may be disposed to overlap the pixels PX. For example, as shown in the embodiments of FIGS. 3B and 3C, all of the optical sensors PHS may at least partially overlap a partial portion of the pixels PX.

As shown in the embodiment of FIG. 3D, the optical sensors PHS may be disposed between the pixels PX to partially overlap the pixels PX. In the embodiment of FIG. 3D, the optical sensors PHS may have a size that is greater than that of the pixels PX. For example, the optical sensor PHS may have a size sufficient to cover at least one pixel PX.

As shown in the embodiment of FIG. 3E, the optical sensors PHS may not overlap the pixels PX (e.g., in the third direction DR3). In the embodiment of FIG. 3E, the optical sensors PHS are solely arranged between the pixels PX and have a size that is smaller than the pixels PX so as not to overlap the pixels PX.

However, embodiments of the present inventive concepts are not limited thereto and the arrangement structure between the pixels PX and the optical sensors PHS may vary from those described above. For example, the shape, arrangement, relative size, number, resolution, and the like of the pixels PX and the optical sensors PHS in the sensing area SA may be variously modified within the scope of the present inventive concepts. For example, unlike the embodiments illustrated in FIGS. 3A to 3E, the optical sensors PHS in the sensing area SA may be disposed with a higher resolution (density) than the pixels PX. For example, a larger number of the optical sensors PHS than the pixels PX may be disposed in the sensing area SA.

In addition, in some embodiments, the pixels PX and the optical sensors PHS may be disposed in a form in which one or more of the embodiments of FIGS. 3A to 3E are combined.

In addition, although the embodiments of FIGS. 3A to 3E illustrate an example in which the optical sensors PHS are regularly arranged in the sensing area SA, the present inventive concepts are not limited thereto, and in other embodiments, the optical sensors PHS may be irregularly arranged in the sensing area SA.

Figure 4:
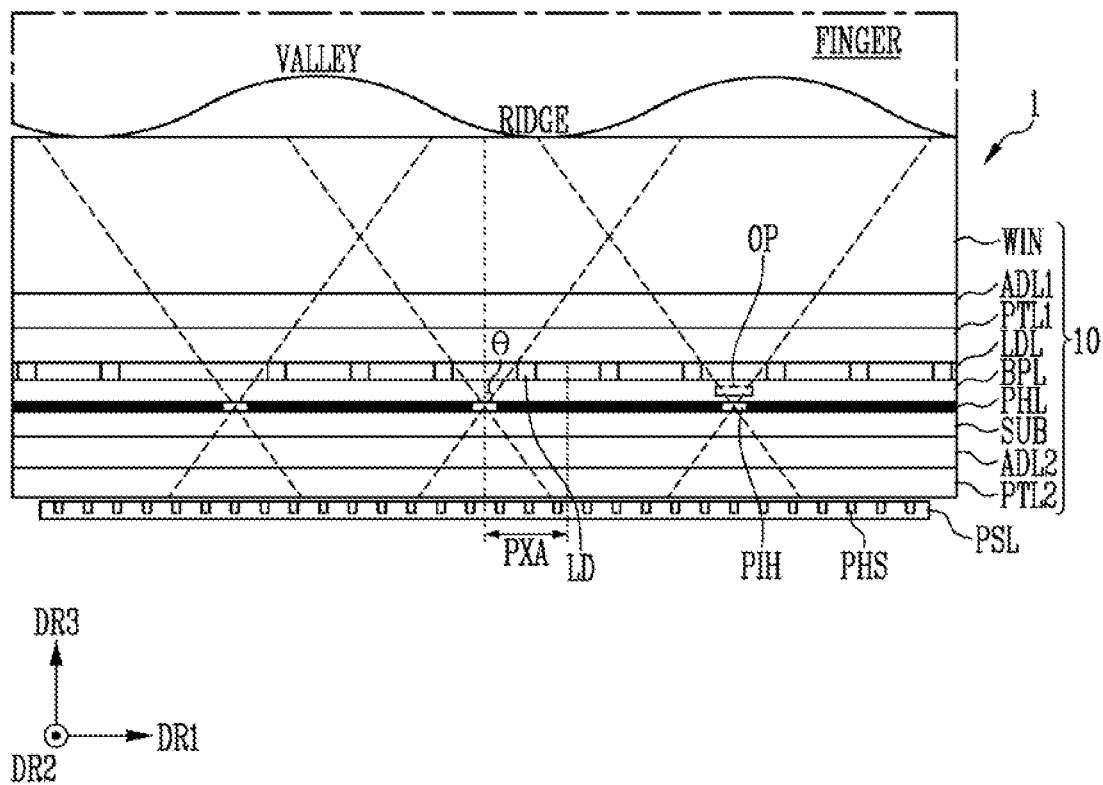
FIG. 4 is a cross sectional view of a display device according to an embodiment of the present inventive concepts.

FIG. 4 is a schematic cross sectional view of a display device according to embodiments of the present inventive concept. In particular, FIG. 4 is a cross-sectional view illustrating the sensing area SA of the display device 1 shown in the embodiments of FIGS. 1 and 2.

Referring to FIGS. 1, 2, and 4, the sensing area SA of the display device 1 according to embodiments of the present inventive concepts may include a display panel 10 and a sensor layer PSL disposed on a first surface (e.g., a lower surface) of the display panel 10. In addition, the display device 1 may include a substrate SUB, and a circuit element layer BPL, a light-emitting element layer LDL, a first protective layer PTL1, a first adhesive layer ADL1, and a window WIN which are sequentially disposed on a second surface (e.g., an upper surface) of the substrate SUB in a third direction DR3. In addition, the display device 1 may further include a second adhesive layer ADL2 and a second protective layer PTL2 which are sequentially disposed between the substrate SUB and the sensor layer PSL in a direction opposite to the third direction DR3. The circuit element layer BPL and the light-emitting element layer Ilk may constitute a pixel layer.

In an embodiment, the substrate SUB may be a base substrate of the display panel 10 and may be a substantially transparent light-transmitting substrate. The substrate SUB may be a rigid substrate including glass or tempered glass or a flexible substrate made of plastic. However, embodiments of the present inventive concepts are not limited thereto and the material of the substrate SUB may be made of various materials.

As shown in the embodiments of FIGS. 1 and 2, the substrate SUB may include a display area AA and a non-display area NA. In addition, the display area AA may include a plurality of pixel areas PXA in which pixels PX are disposed and/or formed.

The circuit element layer BPL is disposed on the substrate SUB and may include at least one conductive layer. For example, the circuit element layer BPL may include a plurality of circuit elements constituting pixel circuits of the pixels PX and lines for supplying various powers and signals for driving the pixels PX. In this embodiment, the circuit element layer BPL may include various circuit elements such as at least one transistor and a capacitor, and a plurality of conductive layers for forming lines connected thereto. In addition, the circuit element layer BPL may include at least one insulating layer provided between the plurality of conductive layers. In addition, the circuit element layer BPL may include a line part disposed in the non-display area NDA of the substrate SUB to supply power and signals corresponding to the lines connected to the pixels PX.

The circuit element layer BPL may include a plurality of openings OP formed in the sensing area SA. The openings OP may be defined as portions in which the circuit elements and the lines included in the circuit element layer BPL are not disposed in a plan view. This will be described in detail with reference to the embodiments of FIGS. 9A to 9J.

The light-emitting element, layer LDL may be disposed on the circuit element layer BPL (e.g., in the third direction DR3). The light-emitting element layer LDL may include a plurality of light-emitting elements LD connected to the circuit elements and/or the lines of the circuit element layer BPL through contact holes or the like. In an embodiment, at least one of the plurality of light-emitting elements LD may be disposed in each pixel area PXA.

In an embodiment, the light-emitting elements LD may emit light having different colors. For example, in an embodiment, the light-emitting elements LD may include red light-emitting elements that emit red light, green light-emitting elements that emit green light, and blue light-emitting elements that emit blue light. In an embodiment, the light-emitting elements LD may include yellow light-emitting elements that emit yellow light, cyan light-emitting elements that emit cyan light, and magenta light-emitting elements that emit magenta light. However, embodiments of the present inventive concepts are not limited thereto, and the light-emitting elements LD may emit the same color light or various other arrangements of different colors.

In an embodiment, the light-emitting element LD may be an organic light-emitting diode. In addition, an inorganic light-emitting diode such as a micro light-emitting diode (micro LED) or a quantum dot light-emitting diode may be selected as the light-emitting element LD. In addition, the light-emitting element LD may be an element made of organic and inorganic materials in combination.

In an embodiment, the pixel PX may include a single light-emitting element LD. In an embodiment, the pixel PX may include a plurality of light-emitting elements LD connected in series, parallel, or in series and parallel.

In an embodiment of the display device 1, the light-emitting elements LD of the pixels PX are used as a light source of a fingerprint sensor. However, embodiments of the present inventive concepts are not limited thereto. For example, the display device according to an embodiment of the present inventive concepts may include a separate light source for detecting a fingerprint.

The first protective layer PTL1 may be disposed on the light-emitting element layer LDL to cover the display area AA. In an embodiment, the first protective layer PTL1 may include a sealing member such as a thin film encapsulation (TFE) layer or an encapsulation substrate and may further include a protective film in addition to the sealing member. Thus, the first protective layer PTL1 may prevent or minimize the formation of a path through which external moisture or oxygen permeates into the display panel 10.

The first adhesive layer ADL1 may be disposed between the first protective layer PTL1 and the window WIN (e.g., in the third direction DR3) to couple the first protective layer PTL1 and the window WIN. In an embodiment, the first adhesive layer ADL1 may include a transparent adhesive such as an optical clear adhesive (OCA) and may include various adhesive materials.

In an embodiment the window VIN may be a protective member disposed at a top of a module of the display device 1 including the display panel 10 and may be a substantially transparent light-transmitting substrate. In an embodiment, the window WIN may have a multi-layered structure selected from a glass substrate, a plastic film, and a plastic substrate. The window WIN may include a rigid or flexible substrate. However, embodiments of the present inventive concepts are not limited thereto and the material of the window WIN may be various transparent light-transmitting materials.

The second protective layer PTL2 may be disposed on the first surface (e.g., a lower surface) of the substrate SUB. The second protective layer PTL2 may be coupled to the substrate SUB through the second adhesive layer ADL2.

The second adhesive layer ADL2 may firmly couple (e.g., attach) the substrate SUB and the second protective layer PTL2. In an embodiment, the second adhesive layer ADL2 may include a transparent adhesive such as an OCA. The second adhesive layer ADL2 may include a pressure sensitive adhesive (PSA) that includes an adhesive material activated when a pressure for bonding to an adhesive surface is applied. In an embodiment in which the second adhesive layer ADL2 includes the PSA, the second adhesive layer may be attached to the adhesive surface only by pressure without separate heat treatment or UV treatment at room temperature.

In an embodiment, the second adhesive layer ADL2 may include a material that absorbs specific light or a material that blocks the specific light. As an example, the second adhesive layer ADL2 may include an infrared light absorbing material that absorbs infrared light having a high energy density or may include an infrared light blocking material that blocks the infrared light.

In an embodiment, the infrared light absorbing material may include an inorganic oxide including antimon-tin oxide (ATO), indium tin oxide (ITO), tungsten oxide, or carbon black, or a metal such as silver (Ag). The inorganic oxide may selectively transmit light in a visible region and absorb infrared light. In addition, in an embodiment, the infrared light absorbing material may include an organic dye.

In an embodiment, the infrared light blocking material may be at least one compound selected from a borate mixture, a carbonate mixture, an alumina mixture, a nitrate mixture, a nitrite mixture, lithium borate and sodium borate, potassium borate, magnesium borate, calcium borate, strontium borate, barium borate, sodium borate, $Na_2B_4O_x$, colemanite, lithium carbonate, sodium carbonate, potassium carbonate, calcium carbonate, calcite, $CaCO_3$, dolomite, and magnesite, in addition, the infrared blocking material may be at least one compound selected from one or more dyes selected from a nickel dithiol-based dye, a dithiol-based metal complex compound, a cyanine-based dye, a squarylium-based dye, a croconium-based dye, a diimmonium-based dye, an aminium-based dye, an ammonium-based, a phthalocyanine-based, a naphthalocyanine-based dye, an aluminum-based dye, an anthraquinone-based dye, a naphthoquinone-based dye, a polymer condensed azo-based pyrrole, a polymethine-based resin and a propyrin-based resin.

When a user's hand is seated (or positioned) on or in proximity to a display surface of the display device 1 (e.g., a surface on which an image is displayed), the display device 1 may perform a function of detecting a fingerprint of a user using the optical sensors PHS to be described below. When external light enters the display device 1 while the fingerprint of the user is detected, light in a visible light region of the external light is blocked by the user's hand. However, infrared light may pass through the user's hand and may be incident on the optical sensors PHS. The infrared light incident on the optical sensors PHS may act as noise, thereby reducing the detection accuracy of light reflected by the user's hand.

In an embodiment of the present inventive concepts described above, when the second adhesive layer ADL2 includes the infrared light absorbing material and/or the infrared light blocking material, even when infrared light of external light passes through the user's hand, the infrared light may be absorbed and/or blocked by the second adhesive layer ADL2 to prevent the infrared light from being incident on the optical sensors PHS, thereby increasing fingerprint recognition accuracy.

The second protective layer PTL2 may block the introduction of external oxygen and moisture and may be provided in the form of a single-layer or multi-layer. In an embodiment, the second protective layer PTL2 is formed in a film form so that the flexibility of the display panel 10 may be further secured. In an embodiment, the second protective layer PTL2 may be coupled to the sensor layer PSL through another adhesive layer including a transparent adhesive such as an OCA.

In an embodiment, an optional light blocking film may be further disposed under the second protective layer PTL2. The optional light blocking film may block light in a specific frequency region, such as infrared light of external light introduced into the display device 1, to prevent the corresponding light from being incident on the optical sensors PHS of the sensor layer PSL. While the optional light blocking film may be disposed under the second protective layer PTL2, embodiments of the present inventive concepts are not limited thereto. For example, in an embodiment, the optional light blocking film may be disposed on any layer of the display device 1 as long as the optional light blocking film is disposed only on the sensor layer PSL.

In addition, when a component that blocks infrared light is included in the display panel 10, the optional light blocking film may be omitted. For example, as described above, when the second adhesive layer ADL2 includes the infrared light absorbing material and/or the infrared light blocking material, the optional light blocking film may be omitted. In an embodiment, when a separate optional light blocking film is disposed in the display device 1, the above-described second adhesive layer ADL2 may not include an infrared light absorbing material and/or an infrared light blocking material.

A light blocking layer PHL may be disposed between the light-emitting element layer LDL and the sensor layer PSL. For example, as shown in the embodiment of FIG. 4, the light blocking layer PHL may be disposed between the substrate SUB and the circuit element layer BPL (e.g., in the third direction DR3). As shown in the embodiment of FIG. 4, the light blocking layer PHL may include a plurality of pinholes PIH. The light blocking layer PHL may block a portion of light incident from the outside, for example, a portion of reflected light that is reflected from a finger and incident through the opening OP in the circuit element layer BPL, thereby allowing only the remaining portion of the light extending through the pinholes PIH to reach a lower layer.

The size of the openings OP need to be sufficiently secured for the reflected light to reach the lower layer through the pinholes PH.

A width (e.g., a diameter) of the pinholes PIH may be formed to have a sin such that light, which satisfies a field of view (FOV) θ (also referred to as "viewing angle") in a certain angular range, passes through each pinhole PIH.

In an embodiment, the width (e.g., a diameter) of the pinholes PIH may have a size that approximately 10 times or more of a wavelength of reflected light. For example, in an embodiment, the pinholes PIH may have a size in a range of about 4 μm to about 5 μm or more of the wavelength of the reflected light to prevent light diffraction. In addition, the width of the pinholes PIH may have a size that is sufficient to prevent image blur and to more clearly detect a shape of a fingerprint. For example, in an embodiment, the pinholes PH may have a width of about 20 μm or less. However, embodiments of the present inventive concepts are not limited thereto, and the width of the pinholes PIH may vary according to a wavelength band of reflected light and/or a thickness of each layer of a module.

An interval (e.g., a pitch) between adjacent pinholes PH may be set in consideration of a distance between the circuit element layer BPL and the sensor layer PSL and a wavelength range of reflected light. For example, in an embodiment, the interval between adjacent pinholes PIH may be determined according to an interval between the circuit element layer BPL and the sensor layer PSL and the viewing angle θ. Accordingly, images observed by the optical sensors PHS may be prevented from overlapping each other, thereby preventing a blur phenomenon of a fingerprint image.

In the embodiment of FIG. 4, the light blocking layer PHL is illustrated as being disposed in the display panel 10. However, embodiments of the present inventive concepts are not limited thereto. For example, in an embodiment, the light blocking layer PHL may be disposed between the display panel 10 and the sensor layer PSL.

The sensor layer PSL may be attached to another surface (e.g., the lower surface) of the display panel 10 so as to overlap at least one area of the display panel 10. The sensor layer PSL may be disposed to overlap the display panel 10 at least in the display area AA. The sensor layer PSL may include the plurality of optical sensors PHS distributed with a predetermined resolution and/or interval. In an embodiment, the interval between the optical sensors PHS may be relatively dense so that the reflected light reflected from an object to be observed (e.g., a specific area of a finger such as a fingerprint area) may be incident on at least two adjacent optical sensors PHS.

The optical sensors PHS of the sensor layer PSL may output an electrical signal corresponding to reflected light received through the pinholes PIH as a sensing signal. Reflected light beams received by the optical sensor PHS may have different optical characteristics, such as a frequency, a wavelength, a size, and the like, according to whether the reflected light beams are generated by a valley or a ridge of a fingerprint of a users finger. Accordingly, the optical sensors PHS may output sensing signals having different electrical characteristics corresponding to the optical characteristics of the reflected light. The sensing signals output by the optical sensors PHS may be converted into an original image and used to identify the user's fingerprint.

Figure 5:
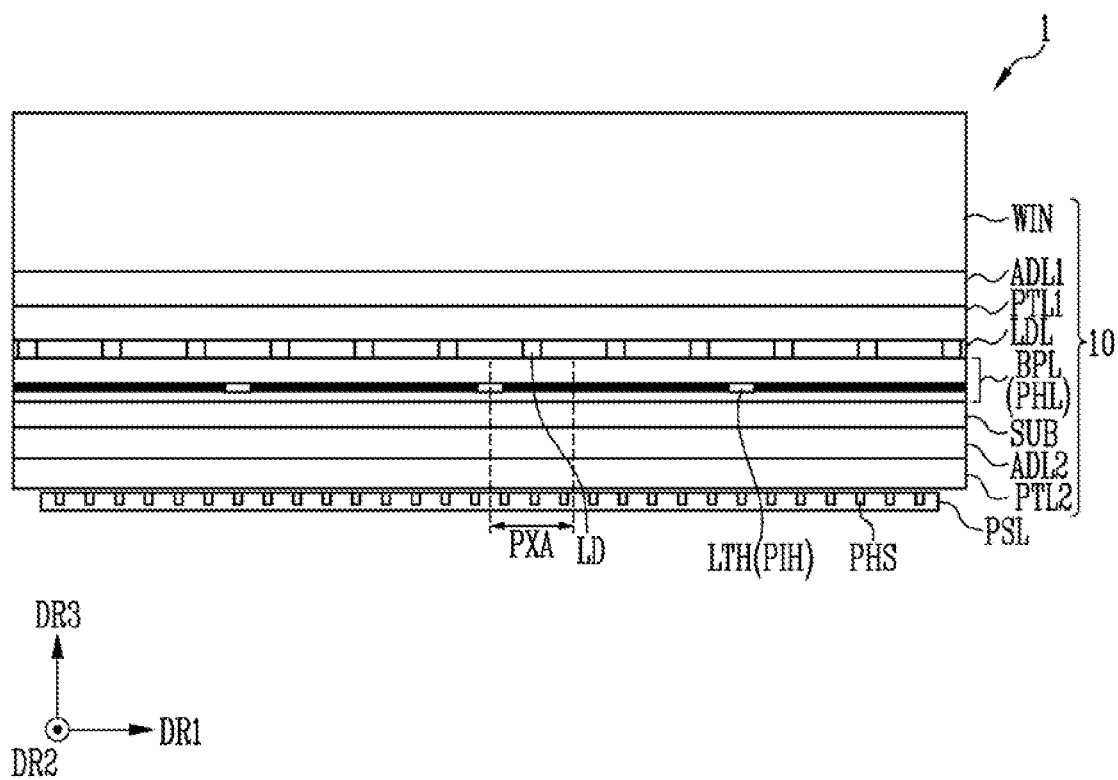
FIG. 5 is a cross-sectional view of a display device according to an embodiment of the present inventive concepts.
Figure 6:
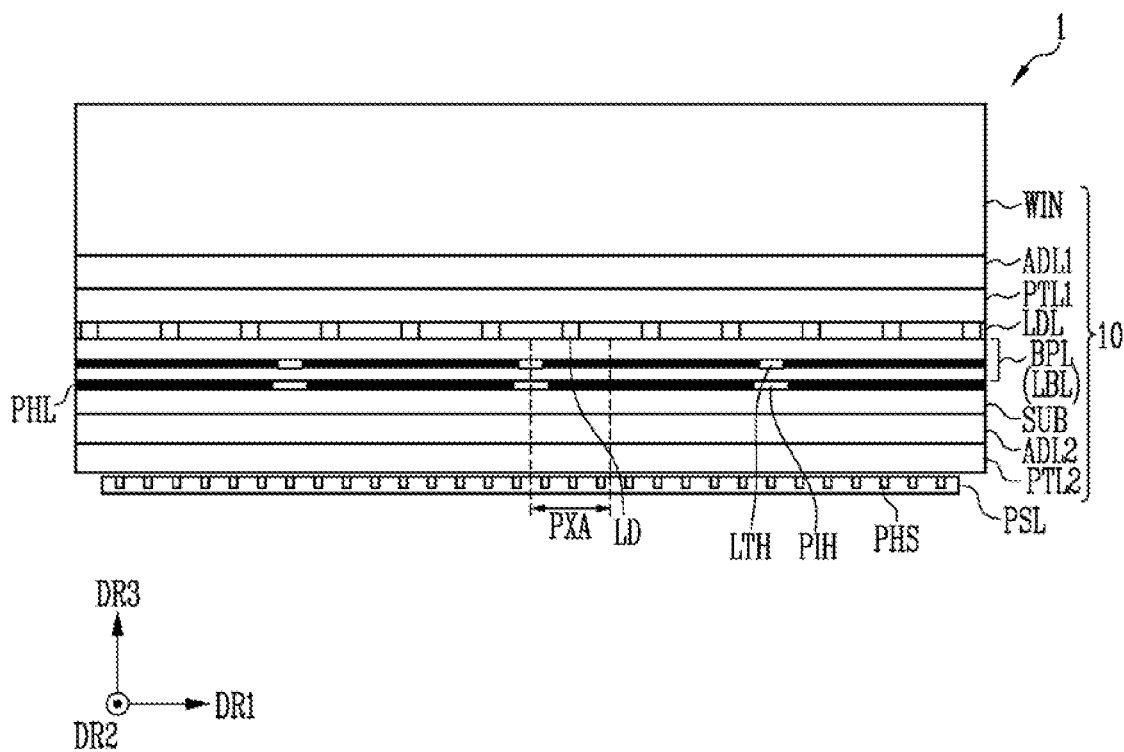
FIG. 6 is a cross-sectional view of a display device according to an embodiment of the present inventive concepts.
Figure 7:
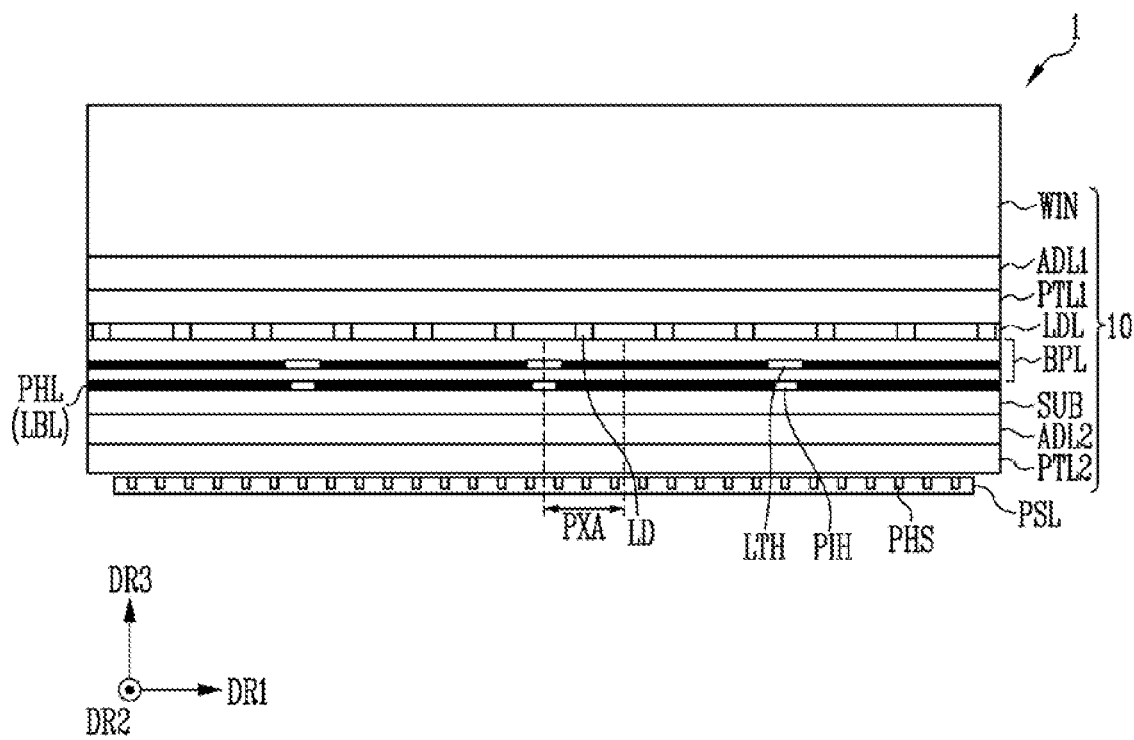
FIG. 7 is a cross-sectional view of a display device according to an embodiment of the present inventive concepts.

FIG. 5 is a schematic cross-sectional view of a display device according to an embodiment of the present inventive concepts. FIG. 6 is a schematic cross-sectional view of a display device according to an embodiment of the present inventive concepts. FIG. 7 is a schematic cross-sectional view of a display device according to an embodiment of the present inventive concepts. In the embodiments of FIGS. 5 to 7, detailed descriptions of components similar or identical to those of the embodiments described above will be omitted for convenience of explanation.

Referring to the embodiment of FIG. 5, a circuit element layer BPL may include a plurality of light transmitting holes LTH (e.g., openings) formed in a sensing area SA. The light transmitting holes LTH may be areas of the circuit element layer BPL in which circuit elements and lines are not disposed. As shown in the embodiment of FIG. 5, the circuit element layer BPL may function as a light blocking layer PHL. For example, the light transmitting holes LTH may function as the pinholes PIH as shown in the embodiment of FIG. 4.

As shown in the embodiment of FIG. 5, when the pinholes PIH are formed using the plurality of light transmitting holes LTH formed in the circuit element layer BPL without separately providing the light blocking layer PHL, it is possible to reduce the thickness of the display device 1 by avoiding the separate provision of the light blocking layer PHL, reduce manufacturing costs, and increase process efficiency.

Referring to the embodiments of FIGS. 6 and 7, a circuit element layer BPL may include a plurality of light transmitting holes LTH. A light blocking layer PHL including a plurality of pinholes PH may be disposed between a substrate SUB and the circuit element layer BPL. Each light transmitting hole LTH and each pinhole PH may be disposed to at least partially overlap each other.

In an embodiment of the present inventive concepts, the light transmitting holes LTH and the pinholes PH may have substantially the same size or different sizes. For example, as shown in the embodiment of FIG. 6, the light transmitting holes LTH may have a width (e.g., a diameter) that is smaller than that of the pinholes PIH. For example, in an embodiment, the pinholes PH and the light transmitting holes LTH may have a width (e.g., a diameter) in a range of about 5 µm to about 20 µm, and the light transmitting hole LTH may have a width (e.g., a diameter) that is smaller than that of the pinholes PIH.

In the embodiment in which the light transmitting holes LTH have a size that is smaller than that of the pinholes PIN, the circuit element layer BPL may function as a light control layer LBL configured to control a path of light (e.g., configured to limit an FOV of reflected light in a predetermined angular range), and the light blocking layer PHL may perform a light blocking function.

For example, as shown in the embodiment of FIG. 7, the light transmitting holes LTH may have a width (e.g. a diameter) that is greater than that of the pinholes PIH. For example, in an embodiment, the light transmitting holes LTH and the pinholes PIH may have a width (e.g., a diameter) in a range of about 5 µm to about 20 µm and the pinholes PIH may have a width (e.g., a diameter) that is smaller than that of the light transmitting holes LTH. In this embodiment, the circuit element layer BPL may perform the light blocking function, and the light blocking layer PHL may function as the light control layer LBL configured to control a path of light.

Figure 8:
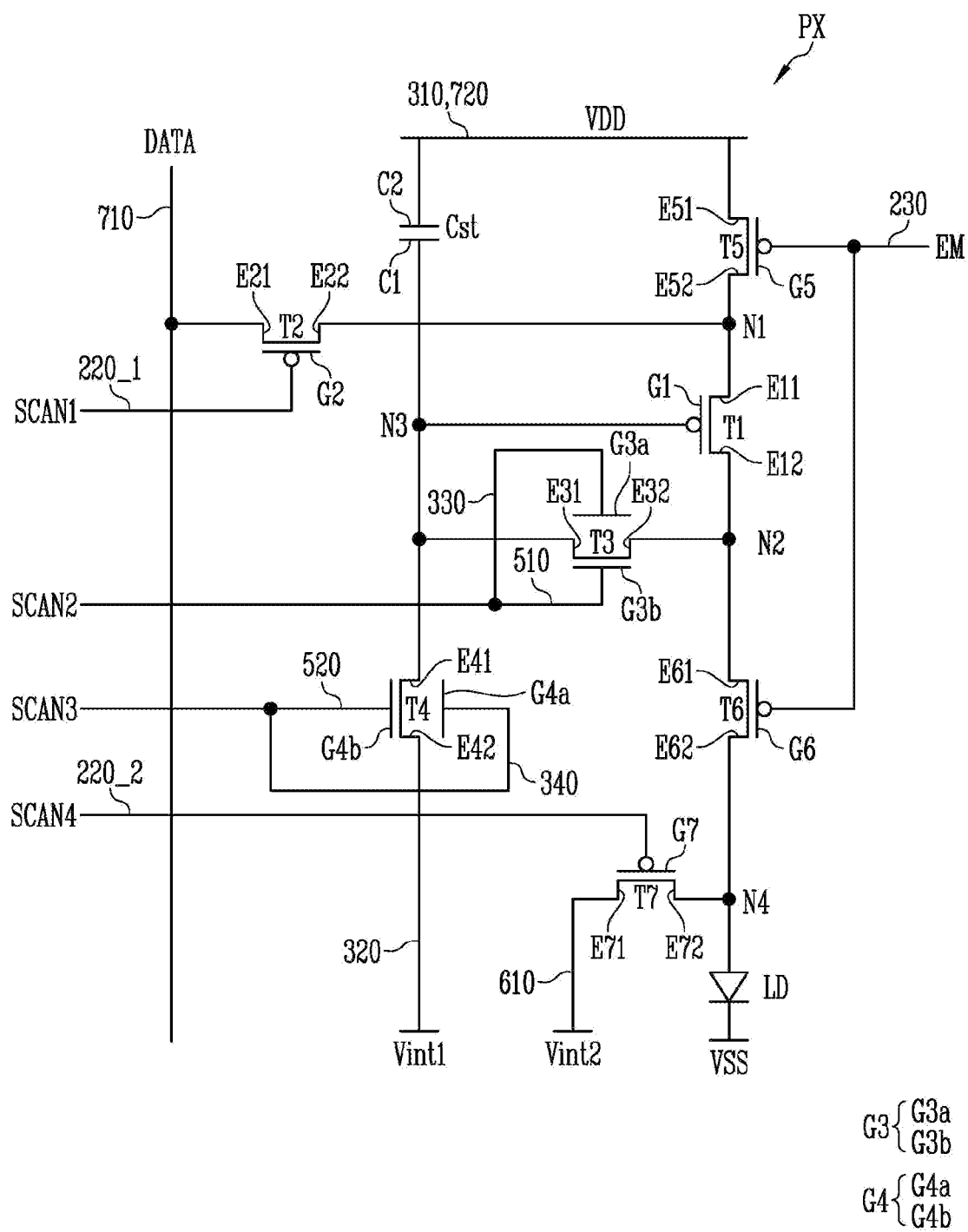
FIG. 8 is a circuit diagram illustrating a pixel according to an embodiment of the present inventive concepts.

FIG. 8 is a circuit diagram illustrating a pixel according to an embodiment of the present inventive concepts.

Referring to the embodiment of FIG. 8, a pixel PX may include a light-emitting element LD, first to seventh transistors T1 to T7, and a storage capacitor Cst.

A first electrode (e.g., an anode or cathode) of the light-emitting element LD may be connected to the sixth transistor T6, and a second electrode (e.g., a cathode or anode) thereof may receive a second driving voltage HISS. The light-emitting element LD may generate light at predetermined luminance in response to an amount of a current supplied from the first transistor T1.

As previously explained, the light-emitting element LD may be an organic light-emitting diode, an inorganic light-emitting diode or an element made of organic and inorganic materials in combination. In the embodiment of FIG. 5, the pixel PX is illustrated to include the single light-emitting element LD. However, in other embodiments, the pixel PX may include a plurality of light-emitting elements. The plurality of light-emitting elements may be connected in series, in parallel, or in series and parallel.

In an embodiment, the first transistor T1, the second transistor T2, the fifth transistor T5, the sixth transistor T6, and the seventh transistor T7 may be formed as polysilicon semiconductor transistors. For example, the first transistor T1 the second transistor T2, the fifth transistor T5, the sixth transistor T6, and the seventh transistor T7 may each include a polysilicon semiconductor layer as an active layer (channel) formed through a low temperature poly-silicon (LTPS) process. In addition, the first transistor T1, the second transistor T2, the fifth transistor T5, the sixth transistor T6, and the seventh transistor T7 are P-type transistors (e.g., P-channel metal oxide semiconductor (PMOS) transistors). Accordingly, a gate-on voltage for turning the first transistor T1, the second transistor T2, the fifth transistor T5, the sixth transistor T6, and the seventh transistor T7 on may have a logic low level.

Since the polysilicon semiconductor transistor has a fast response speed, the polysilicon semiconductor transistor may be applied to switching elements which require fast switching.

In an embodiment, the third transistor T3 and the fourth transistor T4 may be formed as oxide semiconductor transistors. For example, the third transistor T3 and the fourth transistor T4 may be N-type oxide semiconductor transistors (e.g., N-channel metal oxide semiconductor (NMOS) transistors) and may each include an oxide semiconductor layer as an active layer. Accordingly, a gate-on voltage for turning the third transistor T3 and the fourth transistor T4 on may have a logic high level.

In an embodiment, a low temperature process may be performed on the oxide semiconductor transistor, and the oxide semiconductor transistor may have a relatively low charge mobility as compared with the polysilicon semiconductor transistor. For example, the oxide semiconductor transistor may have increased off-current characteristics. Accordingly, in an embodiment in which the third transistor T3 and the fourth transistor T4 are formed as the oxide semiconductor transistors, a leakage current from a second node N2 can be minimized, and thus display quality can be increased.

Meanwhile, in the first transistor T1, the second transistor T2, the fifth transistor T5, the sixth transistor T6, and the seventh transistor T7 formed as polysilicon semiconductor transistors may have a top-gate structure in which a gate electrode thereof is formed on a semiconductor layer.

In an embodiment, the third transistor T3 and the fourth transistor T4 formed as the oxide semiconductor transistors may have a dual-gate structure in which a gate electrode thereof is formed both on and below a semiconductor layer.

A first electrode E11 of the first transistor T1, such as a driving transistor, may be connected to a first node N1, and a second electrode E12 thereof may be connected to the second node N2. A gate electrode of the first transistor T1 may be connected to a third node N3. The first transistor T1 may control an amount of a current flowing to the light-emitting elements LD in response to a voltage of the third node N3. In an embodiment, a first driving voltage VDD may be set to a voltage that is higher than the second driving voltage VSS.

As shown in the embodiment of FIG. 8, the second transistor T2 may be connected between the first node N1 and a data line 710 to which a data signal DATA is supplied. For example, a first electrode E21 of the second transistor T2 may be connected to the data line 710, and the second electrode E22 thereof may be connected to the first node N1. A gate electrode G2 of the second transistor T2 may be connected to a first scan line 220_1. When a first scan signal SCAN1 is supplied to the first scan line 220_1 the second transistor T2 may be turned on to electrically connect the data line 710 and the first node N1.

As shown in the embodiment of FIG. 8, the third transistor T3 may be connected between the second node N2 and the third node N3. For example, a first electrode E31 of the third transistor T3 may be connected to the gate electrode G1 of the first transistor T1 and a second electrode E32 thereof may be connected to the second electrode E12 of the first transistor T1. A gate electrode of the third transistor T3 may be connected to a second scan line 330 or 510. When a second scan signal SCAN2 is supplied to the second scan line 330 or 510, the third transistor T3 may be turned on to electrically connect the second electrode E12 and the gate electrode G1 of the first transistor T1. When the third transistor T3 is turned on, the first transistor T1 may be connected in the form of a diode.

In an embodiment, the gate electrode G3 of the third transistor T3 may have a dual-gate structure and may include a lower gate electrode G3a (FIG. 9C) disposed below the semiconductor layer and connected to the second scan line 330 for transmitting the second scan signal SCAN2 and an upper gate electrode G3b (FIG. 9E) disposed on the semiconductor layer and connected the second scan line 510 for transmitting the second scan signal SCAN2.

As shown in the embodiment of FIG. 8, the fourth transistor T4 may be connected between the third node N3 and a first initialization line 320 for transmitting a first initialization voltage Vint1. For example, a first electrode E41 of the fourth transistor T4 may be connected to the third node N3, and a second electrode E42 thereof may be connected to the first initialization line 320. A gate electrode G4 of the fourth transistor T4 may be connected to a third scan line 340 or 520. When a third scan signal SCAN3 is supplied to the third scan line 340 or 520, the fourth transistor T4 may be turned on to supply the first initialization voltage Vint1 to the third node N3. In an embodiment, the first initialization voltage Vint1 may be set to a voltage that is lower than that of the data signal DATA supplied to the data line 710. Accordingly, a gate voltage of the first transistor T1 may be initialized to the first initialization voltage Vint1 by turning on the fourth transistor 14.

In an embodiment, the gate electrode G4 of the fourth transistor T4 may have a dual-gate structure and may include a lower gate electrode G4a (FIG. 9C) disposed below the semiconductor layer and connected to the third scan line 340 for transmitting the third scan signal SCAN3 and an upper gate electrode G4b (FIG. 9E) disposed on the semiconductor layer and connected the third scan line 520 for transmitting the third scan signal SCAN3.

As shown in the embodiment of FIG. 8 the fifth transistor T5 may be connected between a power line 310 or 720 for transmitting the first driving voltage VDD and the first electrode E11 of the first transistor T1. For example, as shown in the embodiment of FIG. 8, the first electrode E51 of the fifth transistor T5 may be connected to the power line 310 or 720, and a second electrode E52 thereof may be connected to the first electrode E11 of the first transistor T1. A gate electrode G5 of the fifth transistor T5 may be connected to an emission control line 230. In an embodiment, the fifth transistor T5 is turned off when an emission control signal EM is supplied to the emission control line 230, and is turned on otherwise.

As shown in the embodiment of FIG. 8, the sixth transistor T6 may be connected between the second electrode E12 of the first transistor T1 and the first electrode of the light-emitting element LD, such as a fourth node N4. For example, a first electrode E61 of the sixth transistor TB may be connected to the second electrode E12 of the first transistor T1, and a second electrode E62 thereof may be connected to the fourth node N4. A gate electrode G6 of the sixth transistor T6 may be connected to the emission control line 230. The sixth transistor T6 may be controlled substantially the same as the fifth transistor T.

As shown in the embodiment of F G. 8, the seventh transistor T7 may be connected between the first electrode of the light-emitting element LD, such as the fourth node N4, and a second initialization line 610 for transmitting a second initialization voltage Vint2. For example, a first electrode E71 of the seventh transistor T7 may be connected to the second initialization line 610, and the second electrode E72 thereof may be connected to the fourth node N4. A gate electrode G7 of the seventh transistor T7 may be connected to a fourth scan line 220_2. When a fourth scan signal SCAN4 is supplied to the fourth scan line 220_2, the seventh transistor T7 may be turned on to supply the second initialization voltage Vint2 to the first electrode of the light-emitting element LD.

In an embodiment, the fourth scan line 220_2 may be the same scan line as a first scan line in a next row. For example, the fourth scan signal SCAN4 supplied to the fourth scan line 220_2 may be the same signal as a first scan signal supplied to the next row.

When the second initialization voltage Vint2 is supplied to the first electrode of the light-emitting element LD, a parasitic capacitor of the light-emitting element LD may be discharged. As a residual voltage charged in the parasitic capacitor is discharged (removed), unintended micro light emission can be prevented. Therefore, black display capability of the pixel PX may be increased.

As shown in the embodiment of FIG. 8, the storage capacitor Cst may be connected between the power line 310 or 720 and the third node N3. For example, a first electrode C1 of the storage capacitor Cst may be connected to the power line 310 or 720, and a second electrode C2 thereof may be connected to the third node N3. The storage capacitor Cst may store a voltage applied to the third node N3.

FIGS. 9A to 9J are layout views illustrating a stacked structure of the pixel of FIG. 8 according to embodiments of the present inventive concepts. Hereinafter, the expression "overlapping" means that components overlap each other in a plan view, such as in a third direction DR3 that is a thickness direction of the substrate SUB unless otherwise defined.

Referring to the embodiments of FIGS. 8 and 9A to 9J, a pixel PX may be provided in a pixel area PXA. The pixel PX may include a first semiconductor layer 100, a first conductive layer 200, a second conductive layer 300, a second semiconductor layer 400, a third conductive layer 500, a fourth conductive layer 600, and a fifth conductive layer 700 shown in FIGS. 9A to 9J. Insulating layers GI1, GI2, IL1, IL2, IL3, and IL4 may be interposed between the first and second semiconductor layers 100 and 400 and the first to fifth conductive layers 200, 300, 500, 600, and 700. In an embodiment, the insulating layers GI1, GI2, IL1, IL2, IL3, and IL4 may include an inorganic material including an oxide or a nitride. For example, the insulating layers GI1, GI2, IL1, IL2, IL3, and IL4 may include silicon oxide ($SiO_2$), silicon nitride (SiN), silicon oxynitride (SION), or the like.

In an embodiment, the pixel PX may include openings OP described with reference to the embodiment of FIG. 4. The opening OP may be formed in at least a partial portion of the pixel area PXA. The openings OP may be defined as areas in which circuit elements such as the first to seventh transistors T1 to T7 and a storage capacitor Cst, and lines 220, 230, 310, 320, 330, 340, 510, 520, 610, 710, and 720 are not disposed.

As described with reference to the embodiment of FIG. 4, the opening OP formed in the pixel PX (or the circuit element layer BPL, of FIG. 4) should have a sufficient width so that reflected light (e.g., light reflected from a user's finger) may pass therethrough. However, in the embodiment of the pixel PX of FIG. 8, since the circuit elements such as the first to seventh transistors T1 to T7 and the storage capacitor Cst, and the lines 220, 230, 310, 320, 330, 340, 510, 520, 610, 710, and 720 in a pixel area PXA are disposed in relatively large numbers, to secure the width of the opening OP, the pixel area PXA should be relatively wide or some of the circuit elements and/or lines should be removed. However, when the pixel area PXA is formed to be wide, the number of the pixel areas PXA, which may be disposed in a limited display area, is decreased, thereby resulting in a decrease in resolution. In addition, when some of the circuit elements and/or lines are removed, the display quality of a display device 1 may be degraded.

Accordingly, a first initialization line 320 of a second conductive layer 300 included in the pixel PX (or the circuit element layer BPL of FIG. 4) according to an embodiment of the present inventive concepts may be disposed to extend in one direction, such as a first direction DR1, in the pixel area PXA and may include a bent portion that is extends in a diagonal direction with respect to the one direction. The width of the opening OP formed in the pixel PX may be sufficiently secured due to the bent portion of the first initialization line 320. Hereinafter, a structure of the stacked first semiconductor layer 100, the first conductive layer 200, the second conductive layer 300, the second semiconductor layer 400, the third conductive layer 500, the fourth conductive layer 600, and the fifth conductive layer 700 included in the pixel PX will be described in detail with reference to the embodiments of FIGS. 9A to 9I.

Figure 9A:
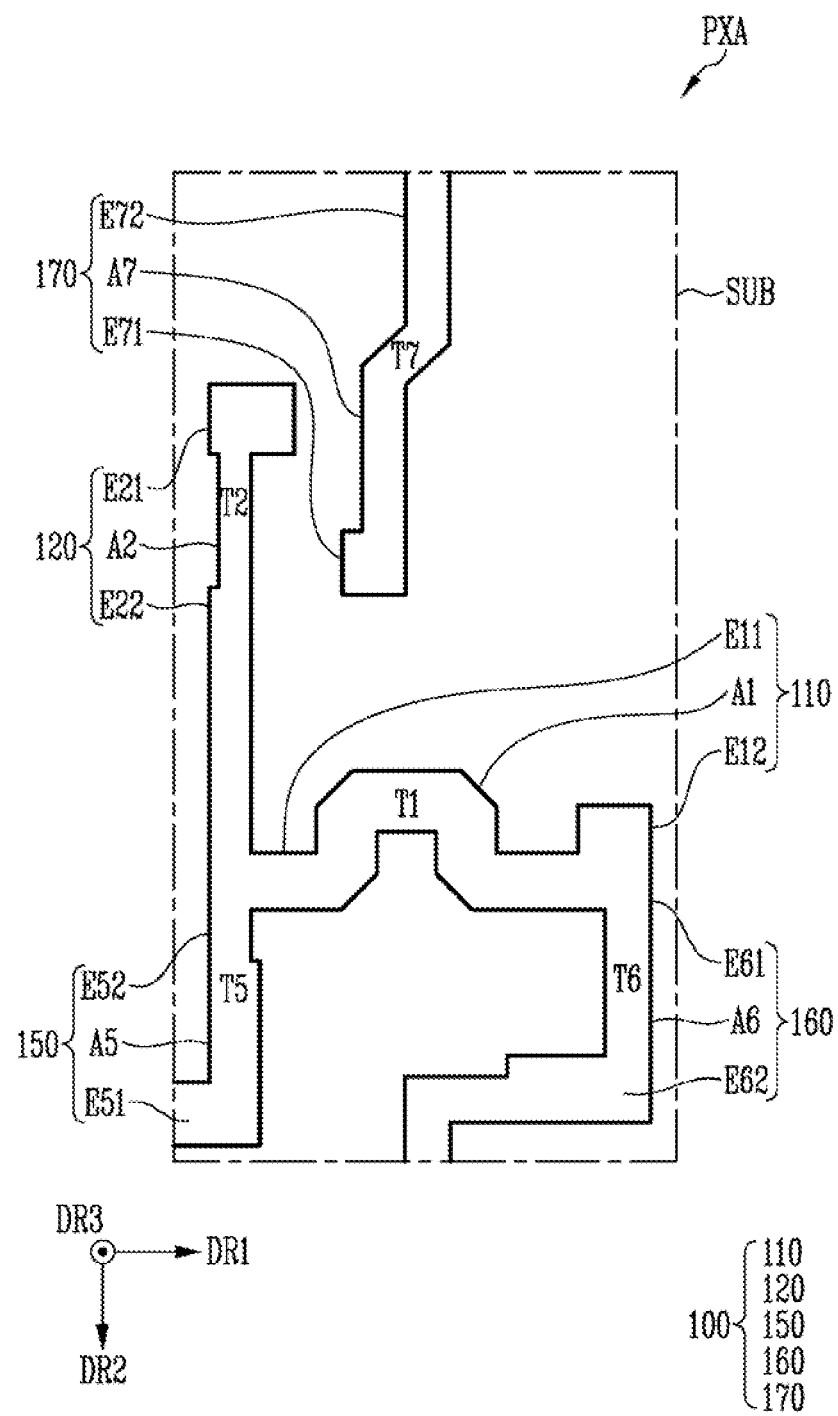
FIGS. 9A to 9J are layout views illustrating a stacked structure of the pixel of FIG. 8 according to embodiments of the present inventive concepts.

Referring to the embodiments of FIGS. 8 and 9A, the first semiconductor layer 100 may be disposed in the pixel area PXA on the substrate SUB and may include a first semiconductor pattern 110, a second semiconductor pattern 120, a fifth semiconductor pattern 150, a sixth semiconductor pattern 160, and a seventh semiconductor pattern 170. In an embodiment, the first semiconductor pattern 110, the second semiconductor pattern 120, the fifth semiconductor pattern 150, the sixth semiconductor pattern 160, and the seventh semiconductor pattern 170 may constitute a first transistor T1, a second transistor T2, a fifth transistor T5, a sixth transistor T6, and a seventh transistor T7, respectively. For convenience of description, the semiconductor patterns are patterns in which a semiconductor material formed in the first semiconductor layer 100 is randomly divided into a plurality of parts. For example, the semiconductor patterns may be partial areas of the semiconductor material of the first semiconductor layer 100.

In an embodiment, the first, second, fifth, sixth and seventh semiconductor patterns 110, 120, 150, 160, and 170 of the first semiconductor layer 100 are disposed on the same layer and may include the same material. For example, in an embodiment the first, second, fifth, sixth and seventh semiconductor patterns 110, 120, 150, 160, and 170 of the first semiconductor layer 100 may include polycrystalline silicon. The polycrystalline silicon may be formed by crystallizing amorphous silicon. Examples of a crystallizing method may include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. However, embodiments of the present inventive concepts are not limited thereto. For example, the first, second, fifth, sixth and seventh semiconductor patterns 110, 120, 150, 160, and 170 of the first semiconductor layer 100 may include single crystal silicon, low temperature polycrystalline silicon, amorphous silicon, or the like.

The first, second, fifth, sixth and seventh semiconductor patterns 110, 120, 150, 160, and 170 of the first semiconductor layer 100 may be connected to each other and may be bent (e.g., extend in different directions) in various shapes. In an embodiment, the seventh semiconductor pattern 170 of the seventh transistor T7 may be connected to a sixth semiconductor pattern 160 of a sixth transistor T6 in a previous row. For example, the seventh semiconductor pattern 170 shown in the embodiment of FIG. 9A may constitute a seventh transistor T7 included in a pixel of a previous row.

The first, second, fifth, sixth and seventh semiconductor patterns 110, 120, 150, 160, and 170 of the first, second, fifth, sixth and seventh transistors T1, T2, T5, T6, and T7 may each include a channel region, and a source region and a drain region which are disposed at both sides of the channel region. In an embodiment, in the semiconductor patterns, primary doping may be performed on the channel region, and secondary doping may be performed on the source region and the drain region using a gate electrode as a mask. However, embodiments of the present inventive concepts are not limited thereto. For example, in an embodiment, the primary doping may be omitted.

The first semiconductor pattern 110 of the first transistor T1 may include a first electrode E11 (e.g., a source electrode or source region), a second electrode E12 (e.g., a drain electrode or drain region), and a channel region A1 between the first electrode E11 and the second electrode E12.

Since the first semiconductor pattern 110 is bent, the channel region A1 may be formed to be elongated, thereby widening a driving range of a gate voltage applied to a gate electrode G1 to be described below. However, the shape of the first semiconductor pattern 110 is not limited to the shape shown in FIG. 9A. For example, the shape of the first semiconductor pattern may be various different shapes, such as "E," "ᄅ," "S," "M," "W", etc.

The second semiconductor pattern 120 of the second transistor T2 may include a first electrode E21 (e.g., a source electrode or source region), a second electrode E22 (e.g., a drain electrode or drain region), and a channel region A2 between the first electrode E21 and the second electrode E22.

As shown in the embodiment of FIG. 9A, the second semiconductor pattern 120 may be disposed to extend substantially in the second direction DR2, and the second electrode E22 of the second semiconductor pattern 120 may be connected to the first electrode E11 of the first semiconductor pattern 110.

The fifth semiconductor pattern 150 of the fifth transistor T5 may include a first electrode E51 (e.g., a source electrode or source region), a second electrode E52 (e.g., a drain electrode or drain region), and a channel region A5 between the first electrode E51 and the second electrode E52.

The fifth semiconductor pattern 150 may be disposed to extend substantially in the second direction DR2, and the second electrode E52 of the fifth semiconductor pattern 150 may be connected to the first electrode E11 of the first semiconductor pattern 110.

The sixth semiconductor pattern 160 of the sixth transistor T6 may include a first electrode E61 (e.g., a source electrode or source region), a second electrode E62 (e.g., a drain electrode or drain region), and a channel region A6 between the first electrode E61 and the second electrode E62.

The sixth semiconductor pattern 160 may have a curved shape in which a partial portion thereof extends substantially in the first direction DR1 and the remaining portion thereof extends substantially in the second direction DR2. The first electrode E61 of the sixth semiconductor pattern 160 may be connected to the second electrode E12 of the first semiconductor pattern 110.

The seventh semiconductor pattern 170 of the seventh transistor T7 may include a first electrode E71 (e.g., a source electrode or source region), a second electrode E72 (e.g., a drain electrode or drain region), and a channel region A7 between the first electrode E71 and the second electrode E72.

The seventh semiconductor pattern 170 may be disposed to extend substantially in the second direction DR2, and the second electrode E72 of the seventh semiconductor pattern 170 may be connected to a second electrode E62 of a sixth transistor T6 in a previous row.

Figure 9B:
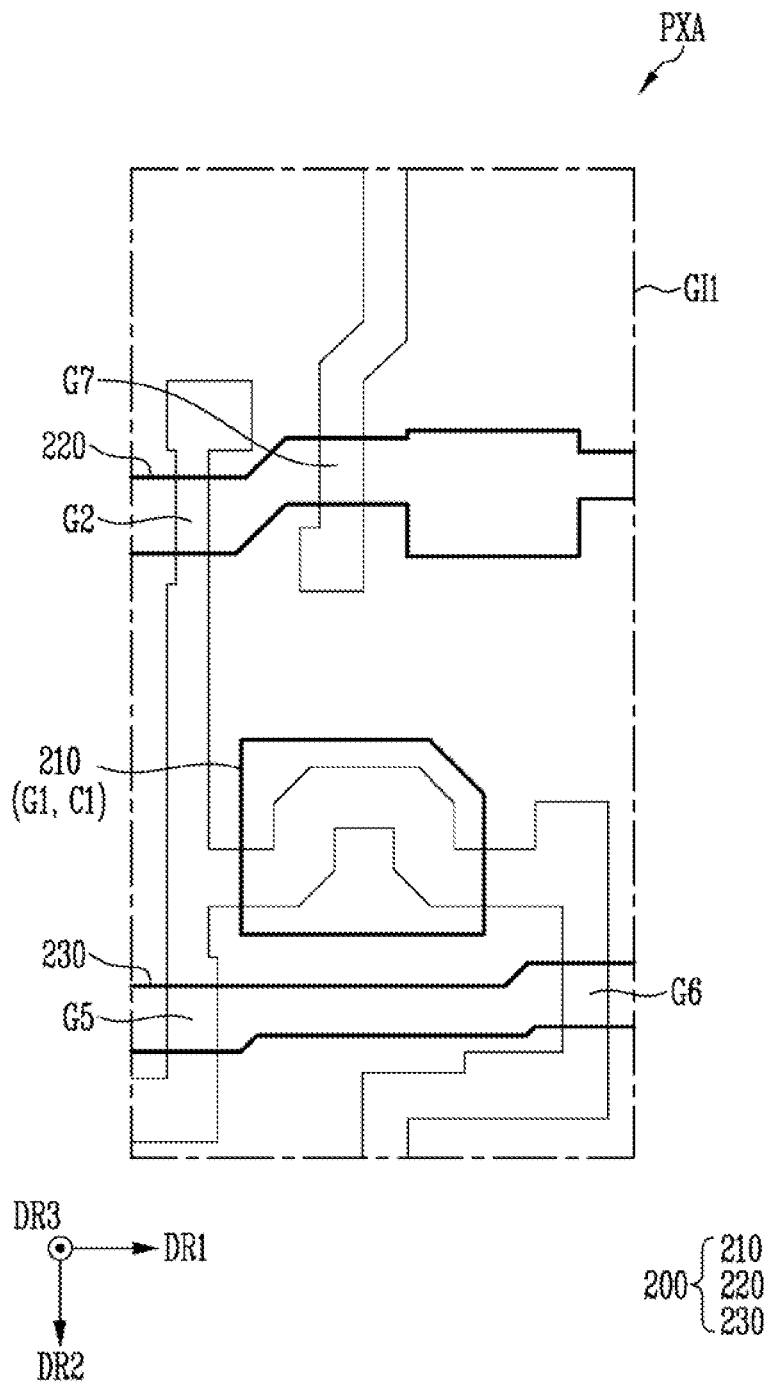

Referring further to the embodiment of FIG. 9B, the first conductive layer 200 may be disposed on the first semiconductor layer 100. A first gate insulating layer GI1 may be disposed between the first semiconductor layer 100 and the first conductive layer 200. In an embodiment, the first gate insulating layer GI1 may cover the first semiconductor layer 100, and the first conductive layer 200 may be disposed on the first gate insulating layer GI1.

As shown in the embodiment of FIG. 9B, the first conductive layer 200 may include an island electrode 210, a first scan line 220 (e.g., a first scan line pattern), and an emission control line 230. The island electrode 210, the first scan line 220 and the emission control line 230 may be disposed on the same layer and may include the same material. In an embodiment, the island electrode 210, the first scan line 220, and the emission control line 230 may include at least one compound selected from molybdenum (Mo), copper (Cu), titanium (Ti), and the like and may be formed as a single-layer or multi-layer.

The island electrode 210 may be disposed to overlap the channel region A1 of the first semiconductor pattern 110 and may form the gate electrode G1 of the first transistor T1.

In addition, the island electrode 210 may also form the first electrode C1 of the storage capacitor Cst. For example, the first electrode C1 of the storage capacitor Cst and the gate electrode G1 of the first transistor T1 are integrally formed.

The island electrode 210 may be an island type. For example, as shown in the embodiment of FIG. 9B, the island electrode 210 may be separated from an adjacent pixel and may be formed in a substantially square shape.

The first scan line 220 may transmit a first scan signal SCAN1 and may be formed to extend substantially in the first direction DR1.

In an embodiment, a partial portion of the first scan line 220 may form the gate electrode G2 of the second transistor T2, and another portion thereof may form the gate electrode G7 of the seventh transistor T7. The gate electrode G2 of the second transistor T2 may overlap the channel region A2 of the second semiconductor pattern 120 of the second transistor T2, and the gate electrode G7 of the seventh transistor 17 may overlap the channel region A7 of the seventh semiconductor pattern 170 of the seventh transistor T7.

Since the seventh semiconductor pattern 170 shown in the embodiment of FIG. 9A corresponds to the seventh transistor T7 included in the pixel of the previous row, the other portion of the first scan line 220 may form a gate electrode G7 of the seventh transistor T7 in the previous row. For example, as described with reference to the embodiment of FIG. 8, the first scan line 220 may be the same scan line as the fourth scan line 220_2 (see FIG. 8) in the previous row, and the first scan signal SCAN1 supplied to the first scan line 220 may be the same signal as the fourth scan signal SCAN4 (see FIG. 8) supplied to the previous row.

The emission control line 230 may transmit an emission control signal EM and may be formed to extend substantially in the first direction DR1.

A partial portion of the emission control line 230 may constitute a gate electrode G5 of the fifth transistor T5, and another partial portion thereof may constitute a gate electrode G6 of the sixth transistor T6. The gate electrode G5 of the fifth transistor T5 may overlap the channel region A5 of the fifth semiconductor pattern 150 of the fifth transistor T5, and the gate electrode G6 of the sixth transistor T6 may overlap the channel region A6 of the sixth semiconductor pattern 160 of the sixth transistor T6.

As shown in the embodiment of FIG. 9B, the first scan line 220 and the emission control line 230 may be spaced apart from each other in the second direction DR2. In addition, the island electrode 210 may be disposed to be spaced apart from the first scan line 220 and the emission control line 230. For example, the island electrode 210 may be disposed between the first scan line 220 and the emission control line 230 in the second direction DR2 and may be separated from both the first scan line 220 and the emission control line 230.

Figure 9C:
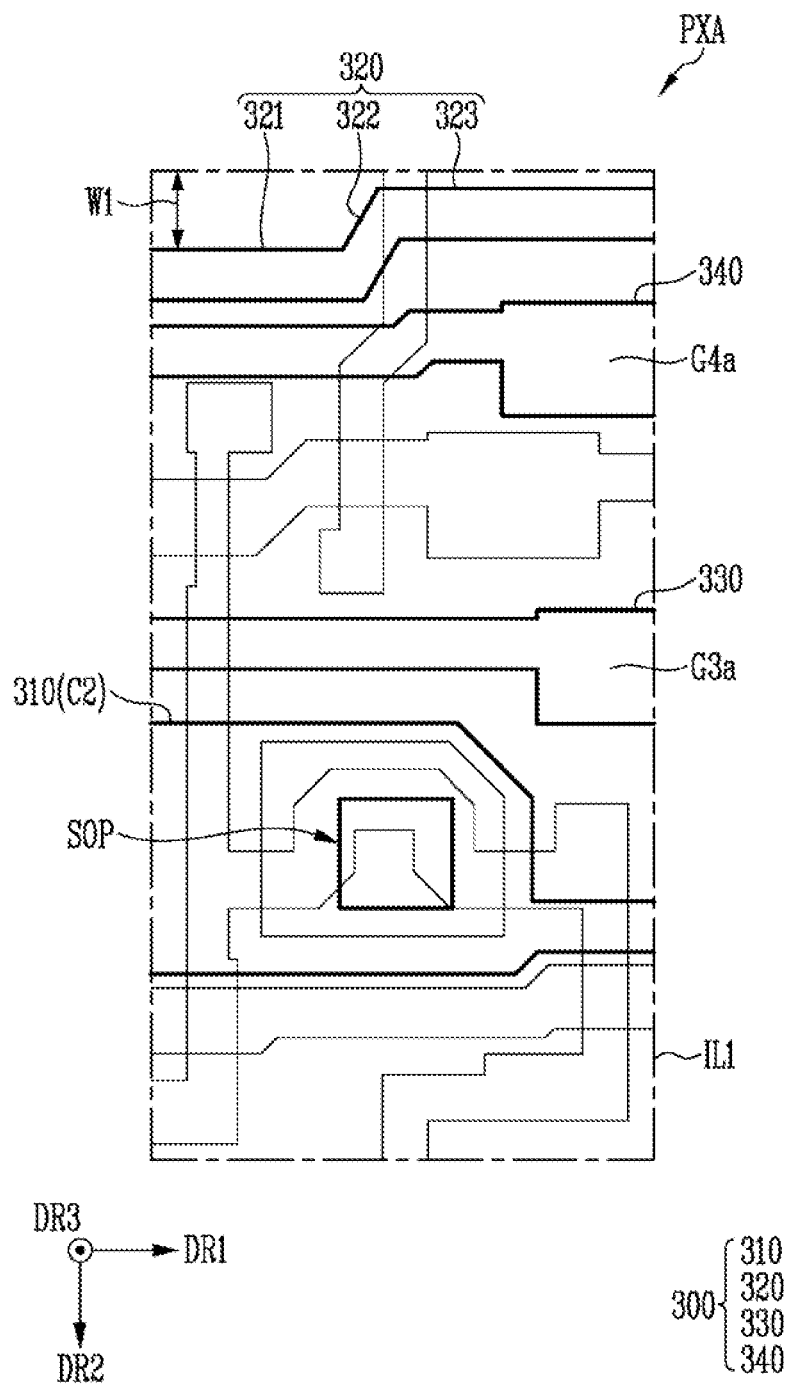

Further referring to the embodiment of FIG. 9C, the second conductive layer 300 may be disposed on the first conductive layer 200. A first insulating layer IL1 may be disposed between the first conductive layer 200 and the second conductive layer 300. In an embodiment, the first insulating layer IL1 may cover the first conductive layer 200, and the second conductive layer 300 may be disposed on the first insulating layer IL1.

As shown in the embodiment of FIG. 9C, the second conductive layer 300 may include a first power line 310, a first initialization line 320, a second scan line 330 (e.g., a second scan line pattern), and a third scan line 340 (e.g., a third scan line pattern). In an embodiment, the first power line 310, the first initialization line 320, the second scan line 330, and the third scan line 340 may be disposed on the same layer and may include the same material. For example, in an embodiment, the first power line 310, the first initialization line 320, the second scan line 330, and the third scan line 340 may include at least one compound selected from molybdenum (Mo), copper (Cu), titanium (Ti), and the like and may be formed as a single-layer or multi-layer.

As shown in the embodiment of FIG. 9C, the first power line 310 may be formed to extend substantially in the first direction DR1 and may transmit a first driving voltage VDD. The first power line 310 may overlap the island electrode 210 of the first conductive layer 200.

At least a partial portion of the first power line 310 may form a second electrode C2 of the storage capacitor Cst. For example, the storage capacitor Cst may be formed by the first electrode C1 and the second electrode C2 spaced apart from each other by the first insulating layer IL1 interposed between the first conductive layer 200 and the second conductive layer 300. In an embodiment, the first insulating layer IL1 interposed between the first conductive layer 200 and the second conductive layer 300 may function as a dielectric of the storage capacitor Cst.

The second electrode C2 of the storage capacitor Cst may have an opening SOP. In an embodiment, the opening SOP may be formed by removing a portion of the second electrode C2 at a position corresponding to a contact hole exposing a portion of the first electrode C1 of the storage capacitor Cst and may have a single closed curve shape. For example, as shown in the embodiment of FIG. 9C, the opening SOP may have a square shape. However, embodiments of the present inventive concepts are not limited thereto.

The second scan line 330 may transmit a second scan signal SCAN2 and may be formed to extend substantially in the first direction DR1. The second scan line 330 may be disposed to overlap at least a partial region of a channel region A3 of a third semiconductor pattern 430 included in the second semiconductor layer 400 to be described below.

A partial portion of the second scan line 330 may form a lower gate electrode G3a of a third transistor T3. The lower gate electrode G3a of the third transistor T3 may overlap the channel region A3 of the third semiconductor pattern 430.

As shown in the embodiment of FIG. 9C, the third scan line 340 may transmit a third scan signal SCAN3 and may be formed to extend substantially in the first direction DR1. However, in an embodiment, the third scan line 340 may include a partial portion that extends diagonally with respect to the first direction DR1 and is disposed between two straight portions of the third scan line 340 which extend substantially in the first direction DR1. The third scan line 340 may be disposed to overlap at least partial region of a channel region A4 of a fourth semiconductor pattern 440 included in the second semiconductor layer 400 to be described below.

A partial portion of the third scan line 340 may constitute the lower gate electrode G4a of the fourth transistor T4. The lower gate electrode G4a of the fourth transistor T4 may overlap the channel region A4 of the fourth semiconductor pattern 440.

As shown in the embodiment of FIG. 9C, the first initialization line 320 may be formed to extend substantially in the first direction DR1 and may transmit a first initialization voltage Vint1.

In an embodiment, the first initialization line 320 may include a first straight portion 321 (e.g., a first portion) and a second straight portion 323 (e.g., a second portion) which are disposed to extend in a straight direction. For example, as shown in the embodiment of FIG. 9C, the first and second straight portions 321, 323 may extend substantially in the first direction DR1. The first initialization line 320 may further include a bent portion 322 (e.g., a third portion) which is disposed between (e.g., directly between) the first straight portion 321 and the second straight portion 323 and extends diagonally with respect to the first direction DR1. For example, as shown in the embodiment of FIG. 9C, the bent portion 322 extends in a direction between the first and second directions DR1, DR2 and the second straight portion 323 is disposed higher (e.g., in the second direction DR2) than the first straight portion 321. In an embodiment, the first straight portion 321, the second straight portion 323, and the bent portion 322 may be integrally formed as the first initialization line 320.

Both the first straight portion 321 and the second straight portion 323 may be disposed to extend substantially in the first direction DR1 and an interval (e.g., distance that the elements are spaced apart) between the first straight portion 321 and the third scan line 340 (e.g., an interval in the second direction DR2) may be less than an interval between the second straight portion 323 and the third scan line 340 the interval in the second direction DR2). For example, as shown in the embodiment of FIG. 9C, since the first straight portion 321 is formed closer to the third scan line 340 than the second straight portion 323, a first width W1 of the opening OP to be described below in the second direction DR2 may be sufficiently secured.

In an embodiment, the first initialization line 320, the third scan line 340, the second scan line 330, and the first power line 310 may be sequentially arranged substantially in the second direction DR2.

Figure 9D:
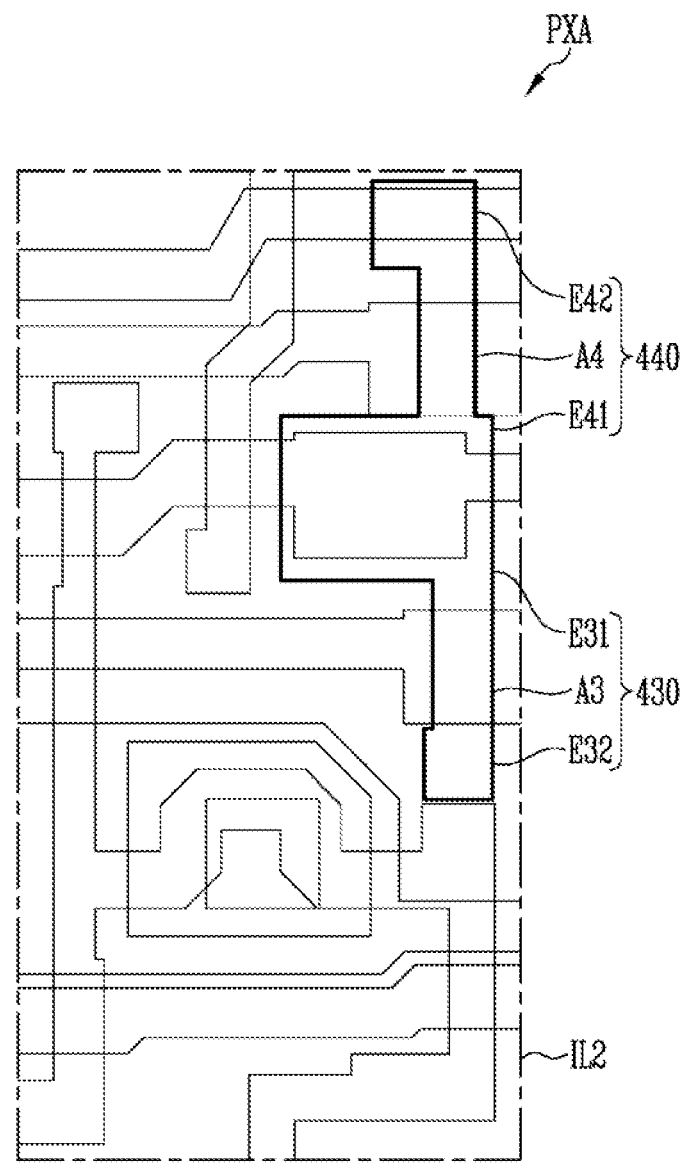

Further referring to the embodiment of FIG. 9D, the second semiconductor layer 400 may be disposed on the second conductive layer 300. A second insulating layer 112 may be disposed between the second conductive layer 300 and the second semiconductor layer 400. In an embodiment, the second insulating layer IL2 may cover the second conductive layer 300, and the second semiconductor layer 400 may be disposed on the second insulating layer IL2.

The second semiconductor layer 400 may include the third semiconductor pattern 430 and the fourth semiconductor pattern 440. The third semiconductor pattern 430 and the fourth semiconductor pattern 440 may constitute a third transistor T3 and a fourth transistor T4, respectively. For convenience of description, the semiconductor patterns are patterns in which a semiconductor material formed in the second semiconductor layer 400 is randomly divided into a plurality of parts. For example, the semiconductor patterns may be partial areas of the semiconductor material of the second semiconductor layer 400.

The third and fourth semiconductor patterns 430 and 440 of the second semiconductor layer 400 are disposed on the same layer and may include the same material. For example, in an embodiment, the semiconductor patterns 430 and 440 of the second semiconductor layer 400 may include an oxide semiconductor.

The third and fourth semiconductor patterns 430 and 440 of the second semiconductor layer 400 may be connected to each other.

The third semiconductor pattern 430 of the third transistor T3 and the fourth semiconductor pattern 440 of the fourth transistor T4 may each include a channel region, and a source region and a drain region at both sides of the channel region. For example, in an embodiment, the source region and the drain region may be regions in which a carrier concentration is increased through plasma treatment. The source region and the drain region may be formed to have conductivity by adjusting a carrier concentration of an oxide semiconductor. For example, the source region and the drain region may be formed by increasing a carrier concentration through plasma treatment on an oxide semiconductor using a hydrogen (H)-based gas, a fluorine (F)-based gas, or a combination thereof. However, embodiments of the present inventive concepts are not limited thereto.

The third semiconductor pattern 430 of the third transistor T3 may includes a first electrode E31 (e.g., a source electrode or source region), a second electrode E32 (e.g., a drain electrode or drain region), and a channel region A3 between the first electrode E31 and the second electrode E32.

The third semiconductor pattern 430 may be disposed to extend in the second direction DR2.

The fourth semiconductor pattern 440 of the fourth transistor T4 may include a first electrode E41 (e.g., a source electrode or source region), a second electrode E42 (e.g., a drain electrode or drain region), and a channel region A4 between the first electrode E41 and the second electrode E42.

As shown in the embodiment of FIG. 9O, the fourth semiconductor pattern 440 may be disposed to extend substantially in the second direction DR2. The first electrode E41 of the fourth semiconductor pattern 440 may be connected to the first electrode E31 of the third semiconductor pattern 430.

Figure 9E:
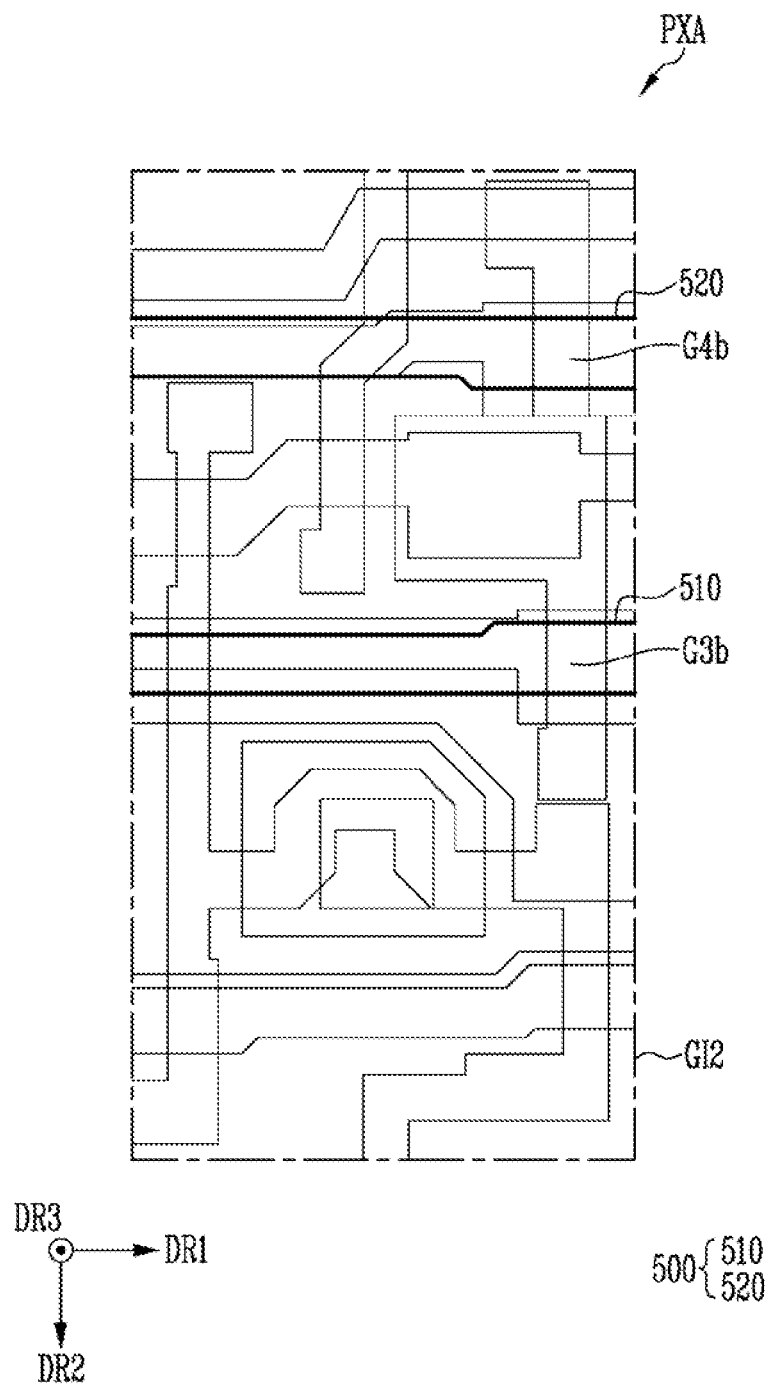

Further referring to the embodiment of FIG. 9E, the third conductive layer 500 may be disposed on the second semiconductor layer 400. A second gate insulating layer GI2 may be disposed between the second semiconductor layer 400 and the third conductive layer 500. In an embodiment, the second gate insulating layer GI2 may cover the second semiconductor layer 400, and the third conductive layer 500 may be disposed on the second gate insulating layer GI2.

As shown in the embodiment of FIG. 9E, the third conductive layer 500 may include a second scan line 510 (e.g., a fourth scan line pattern) and a third scan line 520 (e.g., a fifth scan line pattern). The second and third scan lines 510 and 520 may be disposed on the same layer and may include the same material. For example, in an embodiment, the second and third scan lines 510 and 520 may include at least one compound selected from molybdenum (Mo), copper (Cu), titanium (Ti), and the like and may be formed as a single-layer or multi-layer.

As shown in the embodiment of FIG. 9E, the second scan line 510 may transmit the second scan signal SCAN2 together with the second scan line 330 of the second conductive layer 300 and may be formed to extend substantially in the first direction DR1. The second scan line 510 of the third conductive layer 500 may overlap the second scan line 330 of the second conductive layer 300.

A partial portion of the second scan line 510 may constitute an upper gate electrode G3b of the third transistor T3. The upper gate electrode G3b of the third transistor T3 may overlap the channel region A3 of the third semiconductor pattern 430.

The third scan line 520 may transmit the third scan signal SCAN3 and may be formed to extend substantially in the first direction DR1. The third scan line 520 of the third conductive layer 500 may overlap the third scan line 340 of the second conductive layer 300.

A partial portion of the third scan line 520 may constitute an upper gate electrode G4b of the fourth transistor T4. The upper gate electrode G4b of the fourth transistor T4 may overlap the channel region A4 of the fourth semiconductor pattern 440 included in the second semiconductor layer 400.

As shown in the embodiment of FIG. 9E, the second scan line 510 and the third scan line 520 may be spaced apart from each other substantially in the second direction DR2.

Figure 9F:
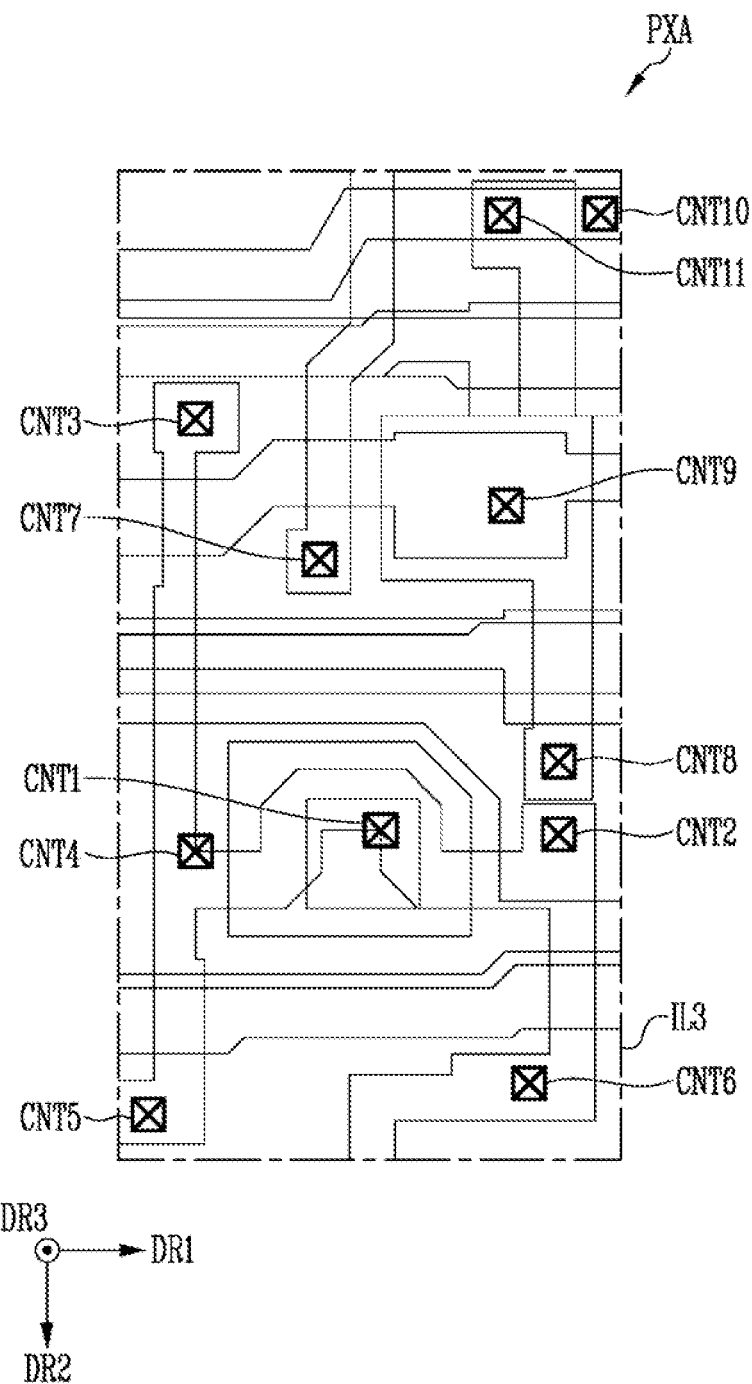
Figure 9G:
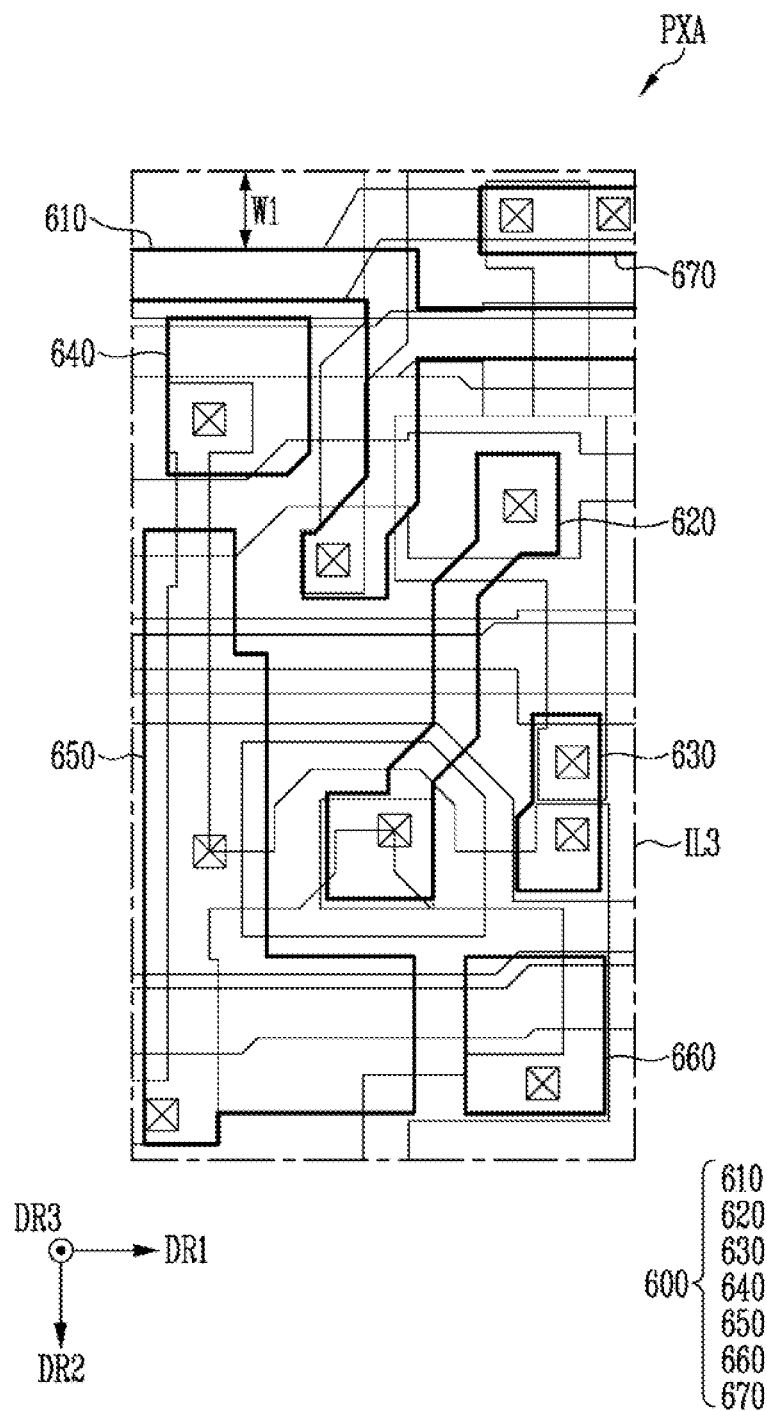

Further referring to the embodiments of FIGS. 9F and 9G, FIG. 9F illustrates first to eleventh contact holes CNT1 to CNT11 exposing at least portions of the first semiconductor layer 100, the first conductive layer 200, the second conductive layer 300, the second semiconductor layer 400, and the third conductive layer 500 shown the embodiments of FIGS. 9A to 9E. In addition, FIG. 9G illustrates the fourth conductive layer 600 disposed on the first semiconductor layer 100, the first conductive layer 200, the second conductive layer 300, the second semiconductor layer 400, and the third conductive layer 500, in which the first to eleventh contact holes CNT1 to CNT11 are formed.

The first to eleventh contact holes CNT1 to CNT11 may pass through at least one of the insulating layers GI1, GI2, IL1, IL2, and IL3 interposed between the first semiconductor layer 100, the first conductive layer 200, the second conductive layer 300, the second semiconductor layer 400, and the third conductive layer 500 to expose partial portions of the first semiconductor layer 100, the first conductive layer 200, the second conductive layer 300 the second semiconductor layer 400, and the third conductive layer 500.

In an embodiment, a third insulating layer IL3 may be disposed between the third conductive layer 500 and the fourth conductive layer 600. The third insulating layer IL3 may cover the third conductive layer 500, and the fourth conductive layer 600 may be disposed on the third insulating layer IL3.

The fourth conductive layer 600 may include a second initialization line 610 and first to sixth connection electrodes 620, 630, 640, 650, 660, 670. The second initialization line 610 and the first to sixth connection electrodes 620, 630, 640, 650, 660, 670 may be disposed on the same layer and may include the same material. For example, in an embodiment, the second initialization line 610 and the first to sixth connection electrodes 620, 630, 640, 650, 660, 670 may be made of a material having high conductivity, such as a metal or a conductive oxide. For example, the second initialization line 610 and the first to sixth connection electrodes 620, 630, 640, 650, 660, 670 may be formed as a single-layer or multi-layer including at least one compound selected from molybdenum (Mo), copper (Cu), titanium (Ti), and the like. In an embodiment, the second initialization line 610 and the first to sixth connection electrodes 620, 630, 640, 650, 660, and 670 be formed as a triple-layer (Ti/Al/Ti) in which titanium, aluminum, and titanium are sequentially disposed.

A first contact hole CNT1 exposing a portion of the gate electrode G1 of the first transistor T1 and a portion of the first electrode C1 of the storage capacitor Cst may be formed, and a ninth contact hole CNT9 exposing a portion of the first electrode E31 of the third transistor T3 may be formed. A first connection electrode 620 of the fourth conductive layer 600 may be connected to the gate electrode G1 of the first transistor T1 and the first electrode C1 of the storage capacitor Cst through the first contact hole CNT1 and the first connection electrode 620 may be connected to the first electrode E31 of the third transistor T3 through the ninth contact hole CNT9.

Accordingly, the gate electrode G1 of the first transistor T1 and the first electrode E31 of the third transistor T3 may be bridge-connected by the first connection electrode 620.

In addition, a second contact hole CNT2 exposing a portion of the second electrode E12 of the first transistor T1 may be formed, and an eighth contact hole CNT8 exposing a portion of the second electrode E32 of the third transistor T3 may be formed. A second connection electrode 630 of the fourth conductive layer 600 may be connected to the second electrode E12 of the first transistor T1 through the second contact hole CNT2, and the second connection electrode 630 may be connected to the second electrode E32 of the third transistor T3 through the eighth contact hole CNT8.

Accordingly, the second electrode E12 of the first transistor T1 and the second electrode E32 of the third transistor T3 may be bridge-connected by the second connection electrode 630.

In addition, a third contact hole CNT3 exposing a portion of the first electrode E21 of the second transistor T2 may be formed. A third connection electrode 640 of the fourth conductive layer 600 may be connected to the first electrode E21 of the second transistor T2 through the third contact hole CNT3.

In addition, a fourth contact hole CNT4 exposing a portion of the f t power line 310 may be formed, and a fifth contact hole CNT5 exposing a portion of the first electrode E51 of the fifth transistor T5 may be formed. A fourth connection electrode 650 of the fourth conductive layer 600 may be connected to the first power line 310 through the fourth contact hole CNT4, and the fourth connection electrode 650 may be connected to the first electrode E51 of the fifth transistor T5 through the fifth contact hole CNT5.

Accordingly, the first electrode E51 and the first power line 310 of the fifth transistor T5 may be bridge-connected by the fourth connection electrode 650.

In addition, a sixth contact hole CNT6 exposing a portion of the second electrode E62 of the sixth transistor T6 may be formed. A fifth connection electrode 660 of the fourth conductive layer 600 may be connected to the second electrode E62 of the sixth transistor T6 through the sixth contact hole CNT6.

As shown in the embodiment of FIG. 9G, the second initialization line 610 may be formed to extend substantially in the first direction DR1 and may include a protrusion protruding in the second direction DR2. The protrusion may overlap the first electrode E71 of the seventh transistor T7.

A seventh contact hole CNT7 exposing a portion of the first electrode E71 of the seventh transistor T7 may be formed. The second initialization line 610 of the fourth conductive layer 600 may be connected to the first electrode E71 of the seventh transistor T7 through the seventh contact hole CNT7. The second initialization line 610 may transmit a second initialization voltage Vint2.

In an embodiment, the second initialization line 610 may overlap the first straight portion 321 of the first initialization line 320. The second initialization line 610 may be disposed such that a first width W1 of the opening OP in the second direction DR2 is sufficiently secured at a portion of the second initialization line 610 overlapping the first straight portion 321 of the first initialization line 320.

In addition, a tenth contact hole CNT10 exposing a portion of the first initialization line 320 may be formed, and an eleventh contact hole CNT11 exposing a portion of the second electrode E42 of the fourth transistor T4 may be formed. A sixth connection electrode 670 of the fourth conductive layer 600 may be connected to the first initialization line 320 through the tenth contact hole CNT10, and the sixth connection electrode 670 may be connected to the second electrode E42 of the fourth transistor T4 through the eleventh contact hole CNT11. Accordingly, the first initialization line 320 and the second electrode E42 of the fourth transistor T4 may be bridge-connected by the sixth connection electrode 670.

Figure 9H:
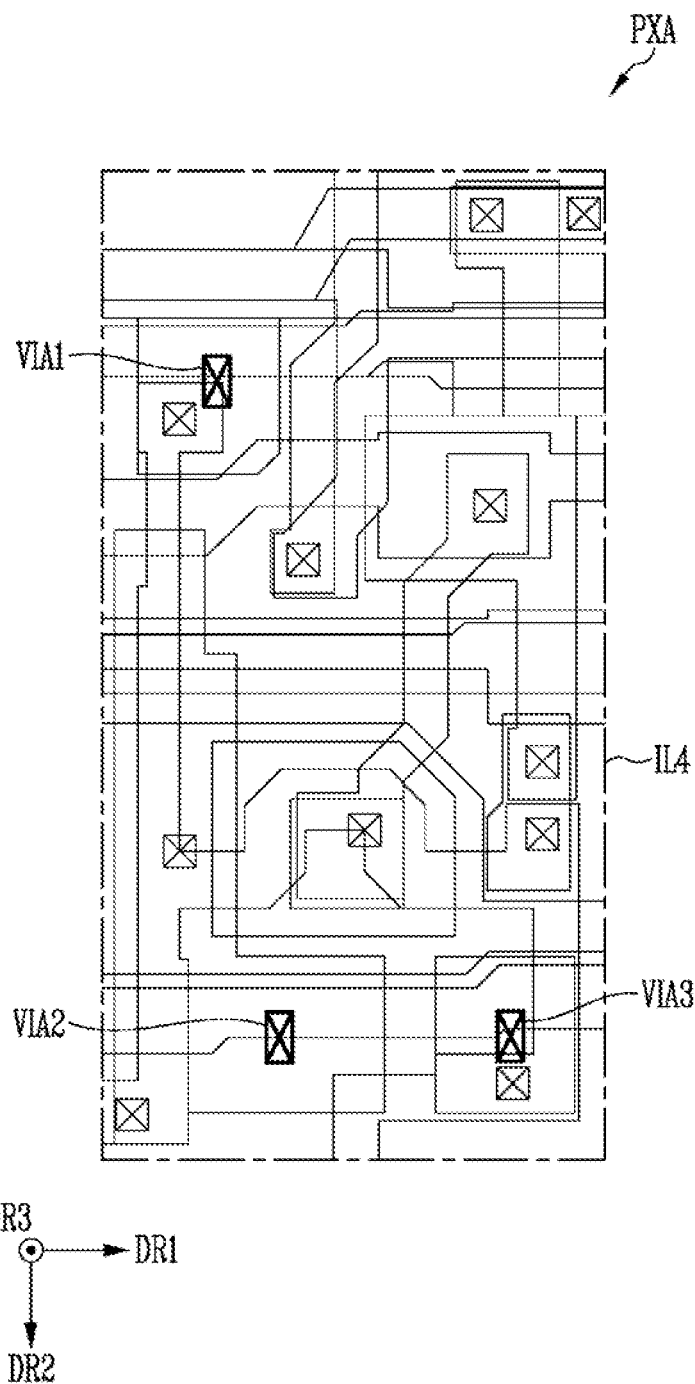
Figure 9I:
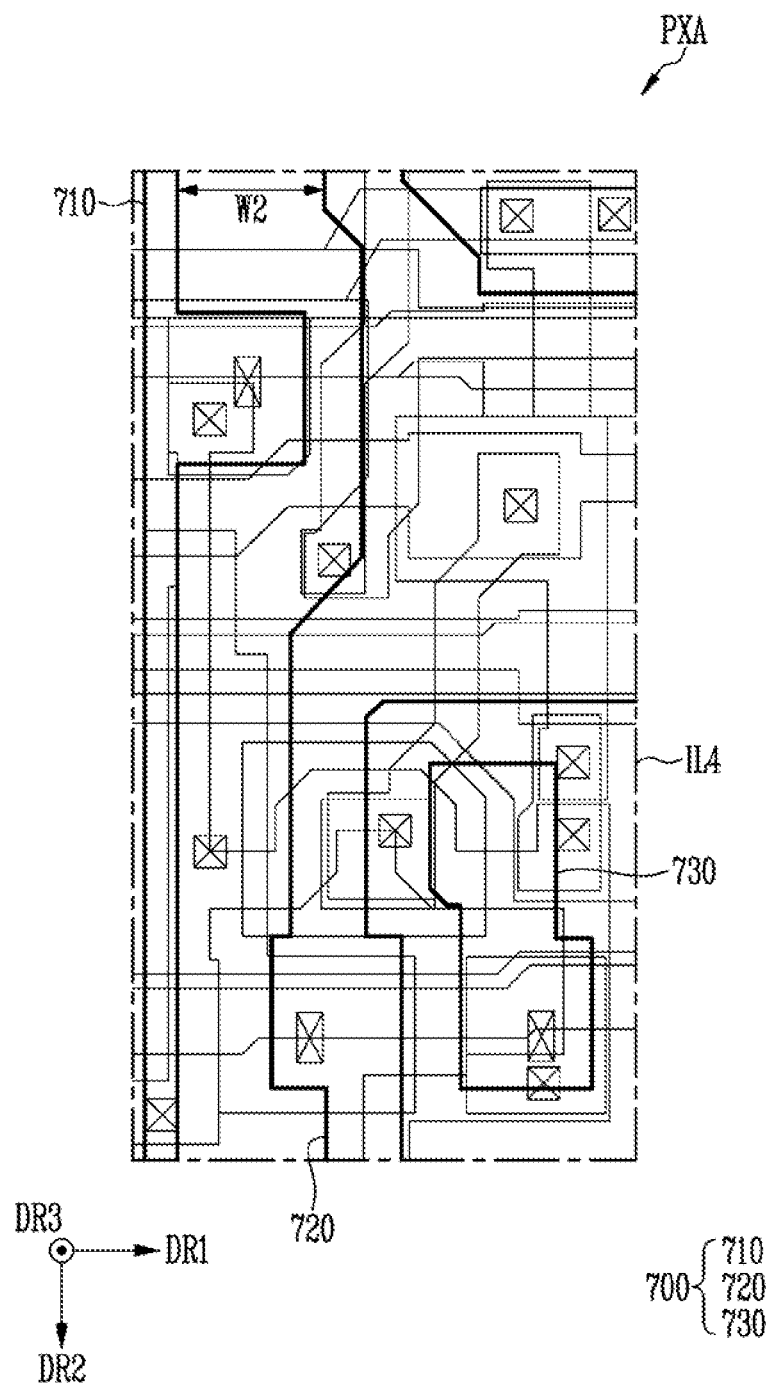

Further FIGS. 9H and 9I, FIG. 9H illustrate first to third via holes VIA1, VIA2, and VIA3 exposing portions of the fourth conductive layer 600 shown in the embodiment of FIG. 9G. In addition, FIG. 9I illustrates the fifth conductive layer 700 disposed on the fourth conductive layer 600 in which the first to third via holes VIA1, VIA2, and VIA3 are formed. In an embodiment, the first to third via holes VIA1, VIA2, and VIA3 may pass through a fourth insulating layer IL4 interposed between the fourth conductive layer 600 and the fifth conductive layer 700 to expose the portions of the fourth conductive layer 600.

The fourth insulating layer IL4 may be disposed between the fourth conductive layer 600 and the fifth conductive layer 700. In an embodiment, the fourth insulating layer IL4 may cover the fourth conductive layer 600, and the fifth conductive layer 700 may be disposed on the fourth insulating layer IL4.

As shown in the embodiment of FIG. 9I, the fifth conductive layer 700 may include a data line 710, a second power line 720, and a bridge electrode 730. The data line 710, the second power line 720, and the bridge electrode 730 may be disposed on the same layer and may include the same material. For example, in an embodiment, the data line 710, the second power line 720, and the bridge electrode 730 may include a material having high conductivity, such as a metal or a conductive oxide. For example, in an embodiment, the data line 710, the second power line 720, and the bridge electrode 730 may be formed as a single-layer or multi-layer including at least one compound selected from molybdenum (Mo), copper (Cu), titanium (Ti), and the like.

As shown in the embodiment of FIG. 9I, the data line 710 and the second power line 720 may be formed to extend substantially in the second direction DR2, and the bridge electrode 730 may be formed in an island type. For example, the bridge electrode 730 may be formed to be separated from adjacent pixels.

In an embodiment, the data line 710 and the second power line 720 may be spaced apart from each other (e.g., in the first direction DR1) such that a second width W2 (e.g., length in the first direction DR1) of the opening OP in the first direction DR1 is sufficiently secured.

The data line 710 may transmit a data signal DATA, and the second power line 720 may transmit the first driving voltage VDD together with the first powerline 310.

As shown in the embodiment of FIG. 9H a first via hole VIA1 exposing at least a portion of the third connection electrode 640 of the fourth conductive layer 600 may be formed. The third connection electrode 640 may be connected to the data line 710 through the first via hole VIM.

Accordingly, the first electrode E21 of the second transistor T2 connected to the third connection electrode 640 may be connected to the data line 710.

In addition, as shown in the embodiment of FIG. 9H, a second via hole VIA2 exposing at least a portion of the fourth connection electrode 650 of the fourth conductive layer 600 may be formed. The fourth connection electrode 650 may be connected to the second power line 720 through the second via hole VIA2.

Accordingly, the first electrode E51 of the fifth transistor T5 connected to the fourth connection electrode 650 may be connected to the second power line 720.

Meanwhile, a power line for transmitting the first driving voltage VDD may be disposed in a mesh structure due to a connection relationship between the first power line 310 and the second power line 720.

In addition, as shown in the embodiment of FIG. 9H, a third via hole VIAS exposing at least a portion of the fifth connection electrode 660 of the fourth conductive layer 600 may be formed. The fifth connection electrode 660 may be connected to the bridge electrode 730 through the third via hole VIAS.

Accordingly, the second electrode E62 of the sixth transistor T6 connected to the fifth connection electrode 660 may be connected to the bridge electrode 730.

Meanwhile, the bridge electrode 730 and a first electrode (e.g., an anode or cathode) of a light-emitting element LD may be connected through a via hole exposing a portion of the bridge electrode 730. Accordingly, the second electrode E62 of the sixth transistor T6 may be connected to the first electrode of the light-emitting element LD.

Figure 9J:
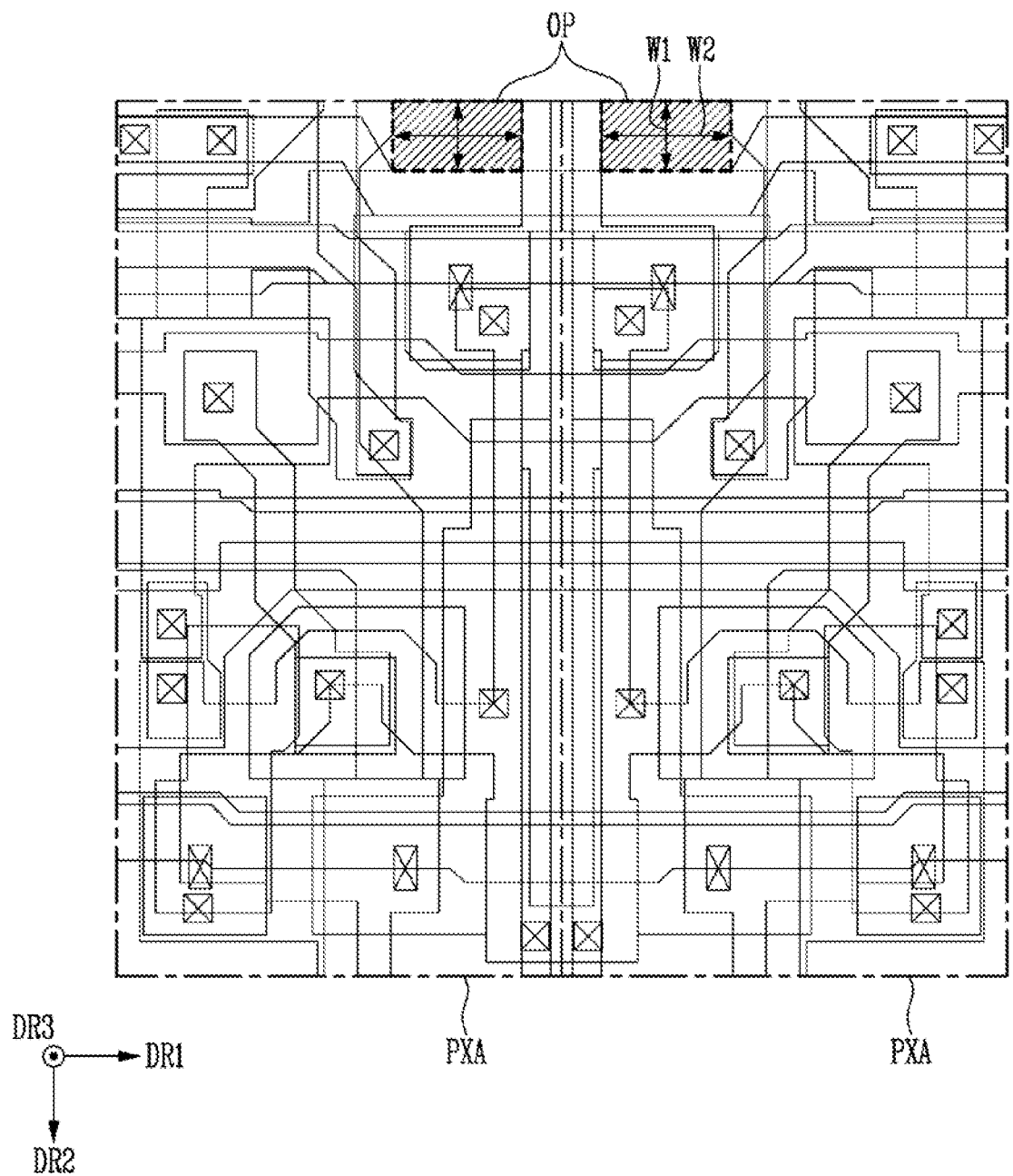

Referring to FIG. 9J, FIG. 9J illustrates the opening OP due to an arrangement relationship between circuit elements such as the first to seventh transistors T1 to T7 and the storage capacitor Cst and the lines 220, 230, 310, 320, 330, 340, 510, 520, 610, 710, and 720 included in the pixel PX.

FIG. 9J illustrates circuit elements and lines disposed in adjacent pixel areas PXA in the first direction DR1. In an embodiment of the present inventive concepts, the circuit elements and the lines disposed in the adjacent areas PXA in the first direction DR1 may be disposed in a symmetrical structure.

As described above, the first width W1 of the opening OP in the second direction DR2 may be defined by the first initialization line 320 including the first and second straight portions 321 and 323 extending in the first direction DR1 and the bent portion 322 bent at a predetermined angle from the first direction DR1 and the second initialization line 610 disposed to overlap the first initialization line 320. The second initialization line 610 may also overlap the first straight portion 321 of the first initialization line 320. For example, in an embodiment, the first width W1 may be about 4.37 μm.

In addition, the second width W2 of the opening OP in the first direction DR1 may be defined by the data line 710 and the second power line 720 which extend in the second direction DR2 and are disposed to be spaced apart from each other. For example, in an embodiment, the second width W2 may be about 5.7 μm.

Accordingly, the first width W1 and the second width W2 of the opening OP are secured to sufficiently secure an area of the opening OP thereby increasing the reliability of a fingerprint sensing function of a fingerprint sensor. For example, in an embodiment, the area of the opening OP may be about 24.91 μm2. However, embodiments of the present inventive concepts are not limited thereto.

A first initialization line included in a pixel of a display device according to an embodiment of the present inventive concepts may be disposed to extend in one direction in a pixel area and may include a bent portion bent in a diagonal line with respect to the one direction. Since the first initialization line is disposed in the pixel area, a minimum width (e.g., an area) of an opening (e.g., a pinhole) formed in a circuit element layer of the pixel may be sufficiently secured for reflected light to reach a lower layer therethrough.

However effects of the present inventive concepts are not limited to the above-described effect, but may be variously modified without departing from the spirit and scope of the present inventive concepts.

Although embodiments of the present inventive concepts have been described, the present inventive concepts may be also used in various other combinations, modifications and environments. For example, the present inventive concepts may be changed or modified and embodiments of the present inventive concepts are not limited to the disclosed embodiments.

What is claimed is:

1. A display device comprising:
   a substrate; and
   a pixel layer disposed on the substrate, the pixel layer including a circuit element layer having an opening,
   wherein the circuit element layer includes a first semiconductor layer, a first conductive layer disposed on the first semiconductor layer, the first conductive layer including a first scan line pattern and an emission control line, a second conductive layer disposed on the first conductive layer, the second conductive layer including a first initialization line that transmits a first initialization voltage, a second scan line pattern, and a third scan line pattern, a second semiconductor layer disposed on the second conductive layer, and a third conductive layer disposed on the second semiconductor layer, the third conductive layer including a fourth scan line pattern and a fifth scan line pattern, and
   wherein the first initialization line includes a first portion and a second portion each extending substantially in a first direction, and a third portion disposed directly between the first portion and the second portion and extending diagonally with respect to the first direction.

2. The display device of claim 1, wherein the first portion, the second portion, and the third portion are integrally formed.

3. The display device of claim 1, wherein the second scan line pattern and the third scan line pattern extend substantially in the first direction.

4. The display device of claim 3, wherein the first initialization line, the third scan line pattern, and the second scan line pattern are sequentially arranged in a second direction that crosses the first direction.

5. The display device of claim 4, wherein an interval between the first portion and the third scan line pattern is less than an interval between the second portion and the third scan line pattern.

6. The display device of claim 4, wherein the second conductive layer further includes a first power line that is spaced apart from the second scan line pattern in the second direction.

7. The display device of claim 4, wherein:
   the fourth scan line pattern and the fifth scan line pattern extend substantially in the first direction; and
   the fifth scan line pattern is spaced apart from the fourth scan line pattern in the second direction.

8. The display device of claim 7, wherein the second scan line pattern and the fourth scan line pattern overlap each other in a thickness direction of the substrate, the second scan line pattern and the fourth scan line pattern are configured to transmit a same scan signal.

9. The display device of claim 7, wherein the third scam line pattern and the fifth scan line pattern overlap each other in a thickness direction of the substrate, the third scan line pattern and the fifth scan line pattern are configured to transmit a same scan signal.

10. The display device of claim 1, wherein:
    the first scan line pattern and the emission control line extend substantially in the first direction; and
    the emission control line is spaced apart from the first scan line pattern in a second direction that crosses the first direction.

11. The display device of claim 1, wherein:
    the first conductive layer further includes an island electrode that is spaced apart from both the first scan line pattern and the emission control line;
    the second conductive layer further includes a first power line that extends substantially in the first direction and is configured to transmit a driving voltage; and
    the island electrode and the first power line overlap each other in a thickness direction of the substrate.

12. The display device of claim 1, wherein:
    the circuit element layer further includes a fourth conductive layer disposed on the third conductive layer, the fourth conductive layer including a second initialization line that transmits a second initialization voltage; and the second initialization line extends substantially in the first direction and includes a protrusion protruding in a second direction that crosses the first direction.

13. The display device of claim 12, wherein the second initialization line overlaps the first portion in a thickness direction of the substrate.

14. The display device of claim 12, wherein the circuit element layer further includes a fifth conductive layer disposed on the fourth conductive layer, the fifth conductive layer including a data line that transmits a data signal and a second power line that transmits a driving voltage.

15. The display device of claim 14, wherein the data line and the second power line extend substantially in the second direction and are spaced apart from each other in the first direction.

16. The display device of claim 14, wherein the first initialization line, the second initialization line, the data line, and the second power line are not disposed on the opening.

17. The display device of claim 1, wherein:
the first semiconductor layer includes a polysilicon semiconductor; and
the second semiconductor layer includes an oxide semiconductor.

18. The display device of claim 1, wherein the pixel layer further includes a light-emitting element layer disposed on the circuit element layer.

19. The display device of claim 18, further comprising:
a sensor layer including optical sensors; and
the substrate is disposed on the sensor layer,
wherein the optical sensors are configured to detect a user fingerprint by detecting light emitted from the pixel layer and reflected by a user's finger.

* * * * *